(12) United States Patent
Shimizu

(10) Patent No.: US 8,264,057 B2
(45) Date of Patent: Sep. 11, 2012

(54) SEMICONDUCTOR DEVICE DRIVING BRIDGE-CONNECTED POWER TRANSISTOR

(75) Inventor: Kazuhiro Shimizu, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 316 days.

(21) Appl. No.: 12/647,191

(22) Filed: Dec. 24, 2009

(65) Prior Publication Data

US 2010/0283116 A1 Nov. 11, 2010

(30) Foreign Application Priority Data

May 8, 2009 (JP) .................................. 2009-113590

(51) Int. Cl.
*H01L 27/06* (2006.01)
(52) U.S. Cl. ................ 257/500; 257/501; 257/E27.011; 257/488; 257/491
(58) Field of Classification Search .................. 257/481, 257/500–551
See application file for complete search history.

(56) References Cited

FOREIGN PATENT DOCUMENTS

| JP | 2005-160177 | 6/2005 |
|----|-------------|--------|
| JP | 2005-160268 | 6/2005 |

OTHER PUBLICATIONS

L. Kiraly, "Solving the Problem of Noise When Driving at High Power and High Frequency by Power IC", International Rectified Design Tips, DT92-1J, http://www.irf-japan.com/technical-info/designtp/dt92-1j.pdf, 1992, pp. 1-4.
Chris Chey, et al., "Precaution During Transition of Power Stage Driven by Control IC", International Rectified Design Tips, DT97-3J, http://www.irf-japan.com/technical-info/designtp/dt97-3j.pdf, 1997, pp. 1-7.
Chris Chey, et al., "Managing Transients in Control IC Driven Power Stages", International Rectifier Design Tips, DT97-3J, 2003, pp. 1-8.

*Primary Examiner* — Mamadou Diallo
(74) *Attorney, Agent, or Firm* — Oblon, Spivak, McClelland, Maier & Neustadt, L.L.P.

(57) ABSTRACT

A semiconductor device includes a low-side circuit, high-side circuit, a virtual ground potential pad, a common ground potential pad and a diode, formed on a semiconductor substrate. The low-side circuit drives a low-side power transistor. The high-side circuit is provided at a high potential region, and drives a high-side power transistor. The virtual ground potential pad is arranged at the high potential region, and coupled to a connection node of both power transistors to supply a virtual ground potential to the high-side circuit. The common ground potential pad supplies a common ground potential to the low-side circuit and high-side circuit. The diode has its cathode connected to the virtual ground potential pad and its anode connected to the common ground potential pad.

13 Claims, 20 Drawing Sheets

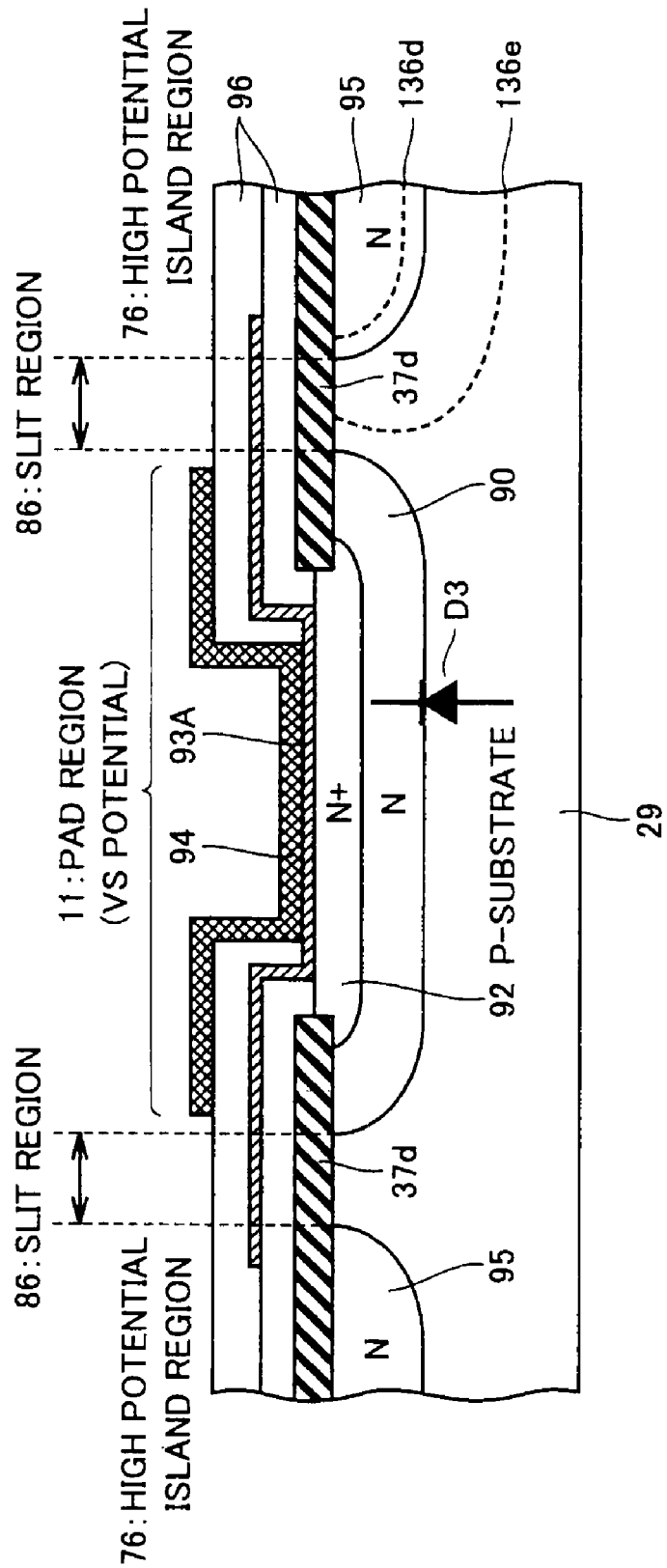

SEMICONDUCTOR DEVICE DRIVING BRIDGE-CONNECTED POWER TRANSISTOR

BACKGROUND OF THE INVENTION

1. Field of the Invention

The present invention relates to a semiconductor device driving a bridge-connected power device in a push-pull manner.

2. Description of the Background Art

A power device of an IGBT (Insulated-Gate Bipolar Transistor) that handles large power is widely used in applications of driving a power motor and the like. A power device (power transistor) is often used in the form of a half-bridge circuit having two power devices driving a load alternately, or an H bridge circuit having four power transistors driving a load alternately.

Such power devices are required to switch more current at high speed. Problems occurring by the parasitic inductance of a bridge circuit in switching high-amperage current at high speed and a method for improving such problem are disclosed in Non-Patent Document 1 ("Solving the Problem of Noise When Driving at High Power and High Frequency by Power IC" by L. Kiraly in International Rectified DESIGN TIPS, DT92-1J, http://www.irf-japan.com/technical-info/designtp/dt92-1j.pdf) and Non-Patent Document 2 ("Precaution During Transition of Power Stage Driven by Control IC" by C. Chey et al. in International Rectified DESIGN TIPS, DT97-3J, http://www.irf-japan.com/technical-info/designtp/dt97-3j.pdf). According to Non-Patent Documents 1 and 2, a diode is connected in the reverse direction between a reference potential node (virtual ground potential node), which is coupled to the connection node of a high-side power transistor and a low-side power transistor (the "high-side" and "low-side" will also imply "high potential side" and "low potential side" in the present specification), and a ground node (common ground node). In other words, the diode has a cathode connected to a virtual ground terminal (VS terminal) and an anode connected to a common ground terminal (GND) outside the high-voltage control IC.

Non-Patent Documents 1 and 2 teach a configuration to solve the problem when there is a parasitic inductance component caused by the interconnections and pads. In a bridge configuration, when the load is an inductive load, a spike-like noise is generated by the current flowing through the free-wheel diode of the low-side power transistor when the high-side power transistor is turned off. The potential at the virtual ground node (VS) becomes lower than the ground potential (GND) due to delay in the turn-on of the free-wheel diode and the forward voltage drop, as well as by the parasitic inductance component at the interconnection. A bootstrap power supply node supplying the power supply voltage to the circuit that drives the high-side power transistor is coupled to the virtual ground node via a decouple capacitor. Furthermore, a diode (also referred to as "bootstrap diode") is connected in the forward direction between the power supply node and the bootstrap power supply node. By the decouple capacitor, the bootstrap power supply (VB) is maintained at the floating power state in order to maintain a voltage Vbs between the bootstrap power supply node (VB) and the virtual ground node (VS) constant.

However, generation of a negative spike-like noise at the virtual ground node (VS) causes reduction in the potential at the bootstrap power supply node (VB) by the decouple capacitor. The bootstrap diode is turned on, so that the high-amperage current from the power supply node flows into the control circuit to damage the control circuit (IC). To prevent this phenomenon, a high-voltage diode of high speed is connected between the virtual ground node (VS) and common ground node (COM) to clamp the lowest potential of the virtual ground node at the ground voltage level. By this clamping operation, the potential of bootstrap power supply (VB) is maintained at the level equal to or higher than the ground voltage to prevent the bootstrap diode from being biased in the forward direction by the spike noise when the high-side power transistor is turned off. Thus, a flow of high-amperage current from the power supply node to eventually damage the control circuit (IC) is prevented.

A configuration directed to preventing the parasitic diode between the bootstrap power supply and common ground in the driving device from being damaged by a noise of the virtual ground potential (VS undershooting) is disclosed in Japanese Patent Laying-Open No. 2005-160177. This publication teaches that a load circuit is connected between the virtual ground node (VS) and common ground node (COM). A series circuit of a diode and thermistor is connected parallel to this load circuit. A diode of a low forward voltage drop, having a forward turn-on time shorter than that of a free-wheel diode, is employed. The diode has its cathode connected to the virtual ground node and its anode connected to the thermistor. The thermistor has a positive temperature characteristic. Further, a capacitor is connected parallel to the load circuit.

This capacitor connected parallel to the load circuit is employed in view of switching loss and noise reduction. When the high-side power transistor is turned OFF, current flows through the series circuit of the diode and thermistor before the free-wheel diode is rendered conductive. Accordingly, subsequent flow of the load current to the capacitor is prevented, suppressing the occurrence of undershooting at the virtual ground node (VS).

Similarly, a configuration directed to suppressing negative spike-like noise (VS undershooting) at the virtual ground node is also disclosed in Japanese Patent Laying-Open No. 2005-160268. This publication teaches that, in order to suppress generation of a virtual ground node regenerative voltage when the high-side power transistor is turned off, a diode is connected in the reverse direction between the virtual ground node and common ground node, and a parallel circuit of a resistor and capacitor with respect to the virtual ground node is connected in series with the diode.

The system in this publication aims to prevent, when turning off the high-side power transistor, generation of a large negative potential at the virtual ground node by turning on the free-wheel diode connected to the low-side power transistor at high speed, and to avoid reduction in the surge absorption effect of the capacitor by discharging the charge in the capacitor by means of the resistor.

The high-voltage diode that clamps the virtual ground potential is arranged outside the drive IC (control circuit) disclosed in the aforementioned documents of related art. In such an arrangement, the diode is coupled to a terminal (pad) of the control circuit (IC) via an external interconnection. It is required that the parasitic inductance component at the interconnections and pads provided for the purpose of external connection with the diode is minimized. This is because the noise caused by the inductance component during variation in current is proportional to the inductance value thereof.

In the case where a diode for clamping is connected outside of the control circuit, reduction in the parasitic inductance component at the interconnection induces a critical constraint in layout, as set forth below. In view of the essential aim of a control IC (control circuit) to drive a power transistor efficiently, the power transistors are preferentially arranged in the proximity of the control IC. Therefore, the high-voltage diode for clamping directed to protecting the control IC (limiting VS undershooting) will be arranged relatively far away from the control IC. The length of the interconnection for the clamping diode becomes longer, which in turn essentially increases the parasitic inductance component. Thus, the possibility of increase in the negative undershooting (VS undershooting) of the virtual ground potential becomes higher.

In order to suppress the effect of the parasitic inductance component at the interconnection for the clamping diode, an approach of inserting an inductance component between the virtual ground potential node of the control IC and the connection node of the power transistors may be considered. However, the high-voltage control IC and power transistors are preferably arranged close to each other, as set forth above. Furthermore, the aforementioned additional inductance component will act as a large resistance component when operating at high frequency during the drive of the power transistor to become the cause of impeding a high-speed switching operation. It is therefore not preferable to connect an additional inductance component between the virtual ground node and the connection node (intermediate node) of power transistors.

Although connecting a diode outside the control IC in order to reduce undershooting at the virtual ground potential node (VS undershooting) is one effective measure, there are many problems to be overcome.

SUMMARY OF THE INVENTION

An object of the present invention is to provide a semiconductor device that can reliably suppress undershooting at a virtual ground potential node without adversely affecting the circuit operation and without increasing the circuit layout area.

According to an aspect of the present invention, a semiconductor device includes a low-side circuit, a high-side circuit, a virtual ground potential pad, a common ground potential pad, and a diode. The low-side circuit is provided at a low potential region formed on a semiconductor substrate region to drive a low-side power transistor. The high-side circuit is provided at a high potential region formed on the semiconductor substrate region, and has a high voltage applied to drive the high-side power transistor. The virtual ground potential pad is arranged at the high potential region, and coupled to a connection node of the high-side power transistor and low-side power transistor to supply a virtual ground potential to the high potential region. The common ground potential pad supplies a common ground potential to the low potential circuit and high potential circuit. The diode is formed on the semiconductor substrate region, having a cathode electrode connected to the virtual ground potential pad and an anode electrode connected to the common ground potential pad.

According to the semiconductor device of the present invention, a diode directed to suppressing undershooting of the virtual ground potential is provided in the semiconductor device constituting a control IC. The main advantage of the present invention is that an external interconnection does not have to be arranged. Increase in the parasitic inductance component can be suppressed to reliably prevent erroneous operation at the circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 22 is a schematic sectional view of a configuration of a high-voltage diode according to a tenth embodiment of the present invention.

DESCRIPTION OF THE PREFERRED EMBODIMENTS

First Embodiment

Figure 1:
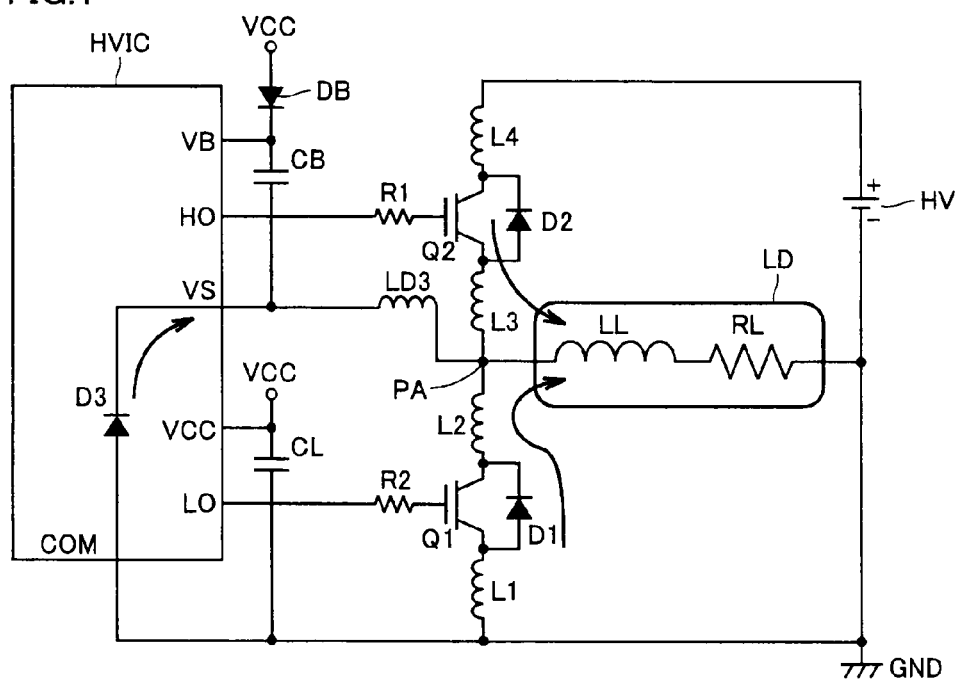
FIG. 1 represents a manner of transistor connection in a high-voltage control circuit for driving a power device according to the present invention.

Referring to FIG. 1, a high-voltage control circuit (semiconductor device) HVIC sets the ON/OFF of a low-side power transistor Q1 and a high-side power transistor Q2. By way of example, power transistors Q1 and Q2 are formed of an IGBT (Insulated Gate Bipolar Transistor), having freewheel diodes D1 and D2 connected in parallel in the reverse direction between the drain and source.

A high voltage supply HV is provided as the power supply for power transistors Q1 and Q2. High voltage supply HV has a positive electrode coupled to a drain node of power transistor Q2, and a negative electrode coupled to a source node of power transistor Q1. Parasitic inductance components L1-L4 are present at the drain and source interconnections of power transistors Q1 and Q2.

A load circuit LD is connected between a connection node (hereinafter, referred to as intermediate node) PA of power transistors Q1 and Q2 and the negative electrode of the high voltage supply. By way of example, load circuit LD includes a series circuit of an inductance component LL and a resistance component RL.

High-voltage control circuit HVIC includes a bootstrap power supply node VB, a high side control signal output node HO, as well as a virtual ground potential node VS, a power supply node VCC, a low side control signal node LO, and a common ground node COM, as external connection nodes. Bootstrap power supply node VB is connected to power supply node VCC via diode DB to be supplied with power supply voltage VCC via diode DB when diode DB is conducting. Using a voltage VB at bootstrap power supply node VB (node and voltage applied thereto are represented by same reference characters), a control signal of a high voltage level is generated at high side control signal output node HO.

A capacitor CB is connected between bootstrap power supply node VB and virtual ground potential node VS. By capacitor CB, bootstrap power supply node VB is set at a floating state, and a difference Vbs between a voltage VS of virtual ground potential node VS that becomes the reference potential of high side control signal output node HO and a voltage VB of bootstrap power supply node VB is maintained constant.

High side control signal output node HO is connected to the gate of high-side power transistor Q2 via a resistance element R1. Virtual ground potential node VS is connected to intermediate node PA. A parasitic inductance component LD3 is present at the interconnection between virtual ground potential node VS and intermediate node PA. Virtual ground potential node VS applies a reference potential with respect to the potential of bootstrap power supply node VB.

Power supply voltage VCC is supplied to power supply node VCC. Low side control signal output node LO is connected to the gate of low-side power transistor Q1 via a resistance element R2. A decoupling capacitor CL is connected between power supply VCC and common ground node COM. Ground voltage GND is supplied to common ground node COM.

Further in high-voltage control circuit HVIC, a high-voltage diode D3 is connected between common ground node COM and virtual ground potential node VS. High-voltage diode D3 has a cathode connected to virtual ground potential node VS and an anode connected to common ground node COM. By providing high-voltage diode D3 within high-voltage control circuit HVIC, the influence of the parasitic inductance component and the like at the interconnection of diode D3 is minimized.

Figure 2:
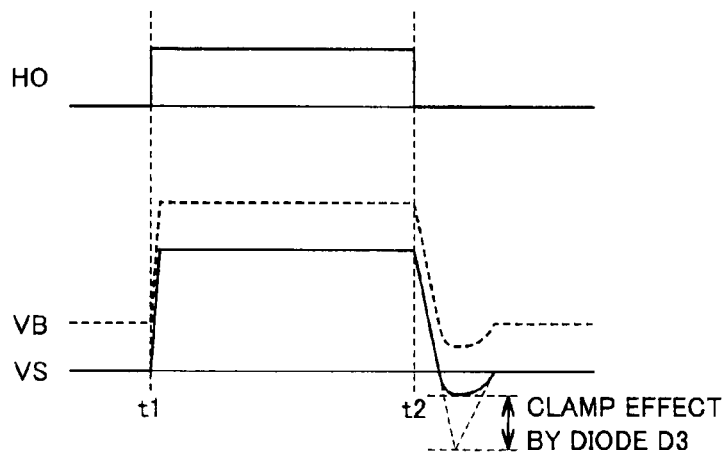
FIG. 2 is a signal waveform diagram representing an operation of the semiconductor device of FIG. 1.

Referring to the signal waveform diagram of FIG. 2, an operation of high-voltage control circuit HVIC of FIG. 1 will be described hereinafter.

At time t1, a control signal from high-side control signal output node HO is pulled up to an H level (logical high). In response, high-side power transistor Q2 is turned on. Current is supplied to load circuit LD from high voltage supply HV. The potential at virtual ground potential node VS rises according to the current supply from high-side power transistor Q2 to intermediate node PA. In response, the potential at bootstrap power supply node VB also rises by the capacitive coupling of decouple capacitor CB. In this case, the difference between voltage VB and VS is maintained constant by capacitor CB.

At this stage, the voltage at bootstrap power supply node VB is greater than or equal to the level of power supply voltage VCC. Diode DB is OFF. Current (charge) is supplied from capacitor CB to bootstrap power supply node VB.

At time t2, a control signal from high-side control signal output node HO is driven to an L level (off state). In response, high-side power transistor Q2 is turned off, whereby the supply of drain current to load circuit LD is stopped. However, inductance component LL present at load circuit LD causes the current to continuously flow according to the inductance value.

At this stage, free-wheel diode D1 provided with respect to low-side power transistor Q1 is turned on to supply current to load circuit LD. Since the current supplied to load circuit LD via free-wheel diode D1 is supplied from ground potential GND via parasitic inductance components L1 and L2 present at the source and drain interconnections of low-side power transistor Q1, the potential at intermediate node PA becomes lower than the level of ground potential (GND).

In accordance with this current supply, the potential at virtual ground potential node VS attains a negative level. In this case, if the potential at bootstrap power supply node VB becomes lower than or equal to the level of ground voltage GND by the capacitive coupling of capacitor CB, high-voltage diode DB is forward-biased, whereby current will flow from power supply node VCC to bootstrap power supply node VB. In high-voltage control circuit HVIC of the first embodiment, internal diode D3 is connected in the forward direction between common ground node COM and virtual ground potential node VS. Therefore, when the potential of virtual ground potential node VS attains a negative potential, high-voltage diode D3 for clamping is turned on to supply current to virtual ground potential node VS. The voltage at virtual ground potential node VS is clamped at the voltage level of GND-Vf that is lower than ground voltage GND at common ground node COM by the forward voltage drop (Vf) of diode D3.

Thus, bootstrap power supply node VB can be prevented from becoming lower than or equal to ground potential, which in turn suppresses high-voltage diode DB from being turned on. In addition, bootstrap power supply node VB can be maintained at the floating power supply state, avoiding an erroneous operation.

Since high-voltage diode D3 for clamping is provided in high-voltage control circuit HVIC, the wiring resistance and inductance are sufficiently low. Even if an inductance component LD3 may be present at the external interconnection between intermediate node PA and virtual ground potential node VS, the inductance value can be suppressed sufficiently low since the line length thereof can be shortened sufficiently. Further, high-voltage control circuit HVIC can be arranged as close as possible to power transistors Q2 and Q1, allowing these power transistors to be switched at high speed.

Figure 3:
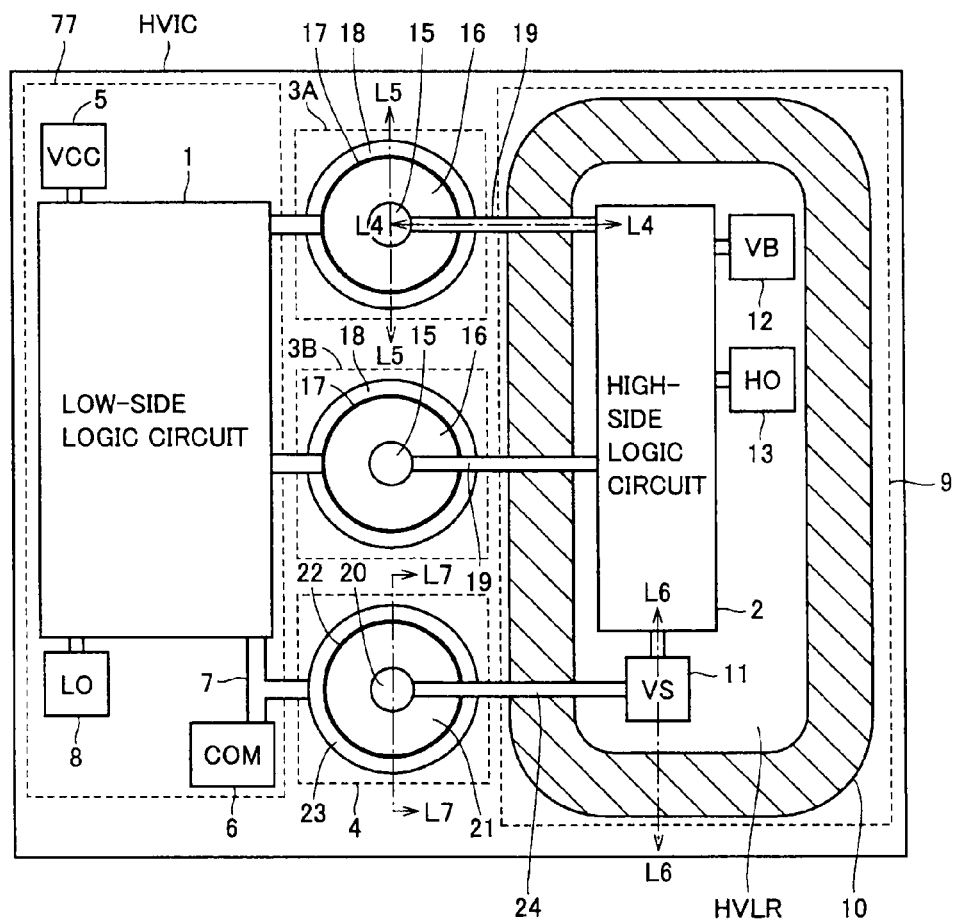
FIG. 3 schematically represents a plan layout of a semiconductor device according to a first embodiment of the present invention.

Referring to the plan layout of FIG. 3, high-voltage control circuit HVIC includes a low-side logic circuit 1 driving low-side power transistor Q1, shown in FIG. 1, and a high-side logic circuit 2 driving high-side power transistor Q2 shown in FIG. 1. Between low-side logic circuit 1 and high-side logic circuit 2 are provided formation regions 3A and 3B for an N channel MOSFET (Metal Oxide Semiconductor Field Effect Transistor formerly known as Insulated Gate Field Effect Transistor) that shifts the level of a low potential control signal from low-side logic circuit 1, and a formation region 4 for a high-voltage diode that clamps the potential of virtual ground potential node VS.

With respect to low-side logic circuit 1, there are provided a power supply pad 5 where power supply voltage VCC is supplied, a pad 6 coupled to common ground node COM, and a pad 8 coupled to low-side control signal output node LO. Low-side logic circuit 1 and pads 5, 6 and 8 are formed at a low-side logic circuit formation region 77.

Low-side logic circuit 1 drives the gate potential of low-side power transistor Q1 shown in FIG. 1 according to a control signal from a controller (microprocessor and the like) not shown, and also generates a low potential control signal directed to controlling the gate potential of high-side power transistor Q2.

At the N channel MOSFET for level shifting formed at each of formation regions 3A and 3B, a drain current flows according to a low potential control signal from low-side logic circuit 1. According to this drain current flowing via level shift interconnection 19, a signal of the level of bootstrap power supply voltage VB is generated in high-side logic circuit 2.

With respect to high-side logic circuit 2, a pad 12 coupled to bootstrap power supply node VB, a virtual ground pad 11 coupled to virtual ground potential node VS, and an output pad 13 coupled to a high-side control signal output node HO are provided. High-side logic circuit 2 generates a gate signal for high-side power transistor Q2 according to a level-shifted signal transmitted in the form of a drain current via high-voltage N channel MOSFETs 3A and 3B (the region and transistor formed thereat are represented by the same reference character). The generated gate signal is output via output pad 13 (high side control signal output node HO).

High-side logic circuit 2 and pads 11-13 are formed at a region HVLR surrounded by a high-voltage isolation region 10 in a high-voltage potential island 9. High-voltage isolation region 10 is realized by a high-voltage diode configuration for PN junction isolation, for example, and isolates a low-side logic circuit formation region (77) and N channel MOSFET formation regions 3A, 3B from high-side logic circuit formation region HVLR to prevent the high voltage during operation of high-side logic circuit 2 from adversely affecting other regions.

Since high-voltage N channel MOSFETs 3A and 3B have the same configuration, same reference characters are allotted to corresponding elements in FIG. 3. Each of high-voltage MOSFETs 3A and 3B for level shifting includes a drain region 15 formed at the central region, a drift region 16 formed concentrically so as to surround drain region 15, a gate electrode 17 formed concentrically so as to surround drift region 16, and a source region 18 formed along the outer circumference of gate electrode 17.

A level shift interconnection 19 is connected to drain region 15. Gate electrode 17 receives a gate signal of low potential from low-side logic circuit 1. The gate signal is converted into a drain current to be delivered to high-side logic circuit 2. A common ground voltage (GND) from common ground pad 6 is supplied to source region 18 of each of high-voltage MOSFETs 3A and 3B. By the concentric formation of high-voltage MOSFETs 3A and 3B, the channel width is increased to allow the flow of a drain current of high amperage.

High-voltage diode 4 formed at diode formation region 4 (the formation region and diode are represented by the same reference character) corresponds to high-voltage diode D3 for clamping shown in FIG. 1, and is realized by an MOSFET transistor configuration, likewise with high-voltage N channel MOSFETs 3A and 3B. Namely, at high-voltage diode formation region 4, a cathode region 20 is formed at the central region around which a drift region 21 is formed. A gate electrode 22 is formed to surround drift region 21, and an anode region 23 is formed along the outer circumference of gate electrode 22. Anode region 23 is coupled to common ground pad 6 via an internal interconnection 7. A cathode region 20 is coupled to virtual ground pad 11 via an internal interconnection 24. In this high-voltage diode formation region 4, gate electrode 22 is not connected. This gate electrode 22 is employed as a field plate for alleviating the electric field and for ensuring a depletion layer.

Since the length of the internal interconnection is set as short as possible in high-voltage control circuit HVIC, as shown in FIG. 3, high-voltage N channel MOSFETs 3A and 3B are arranged in the proximity of logic circuits 1 and 2. Likewise with these high-voltage N channel MOSFETs 3A and 3B, high-voltage diode D3 is formed in high-voltage diode formation region 4, utilizing a transistor configuration identical to that of MOSFETs 3A and 3B, in the proximity of logic circuits 1 and 2. Thus, the length of interconnections 7 and 24 of high-voltage diode D3 can be shortened, so that the parasitic inductance component thereof is reduced. Undershooting at virtual ground potential node VS (VS undershooting) can be reliably suppressed.

This high-voltage diode 4 (D3) has a configuration similar to that of MOSFETs 3A and 3B for level shifting. MOSFETs 3A and 3B for level shifting and high-voltage diode 4 (D3) can be produced in the same fabrication step.

Figure 4:
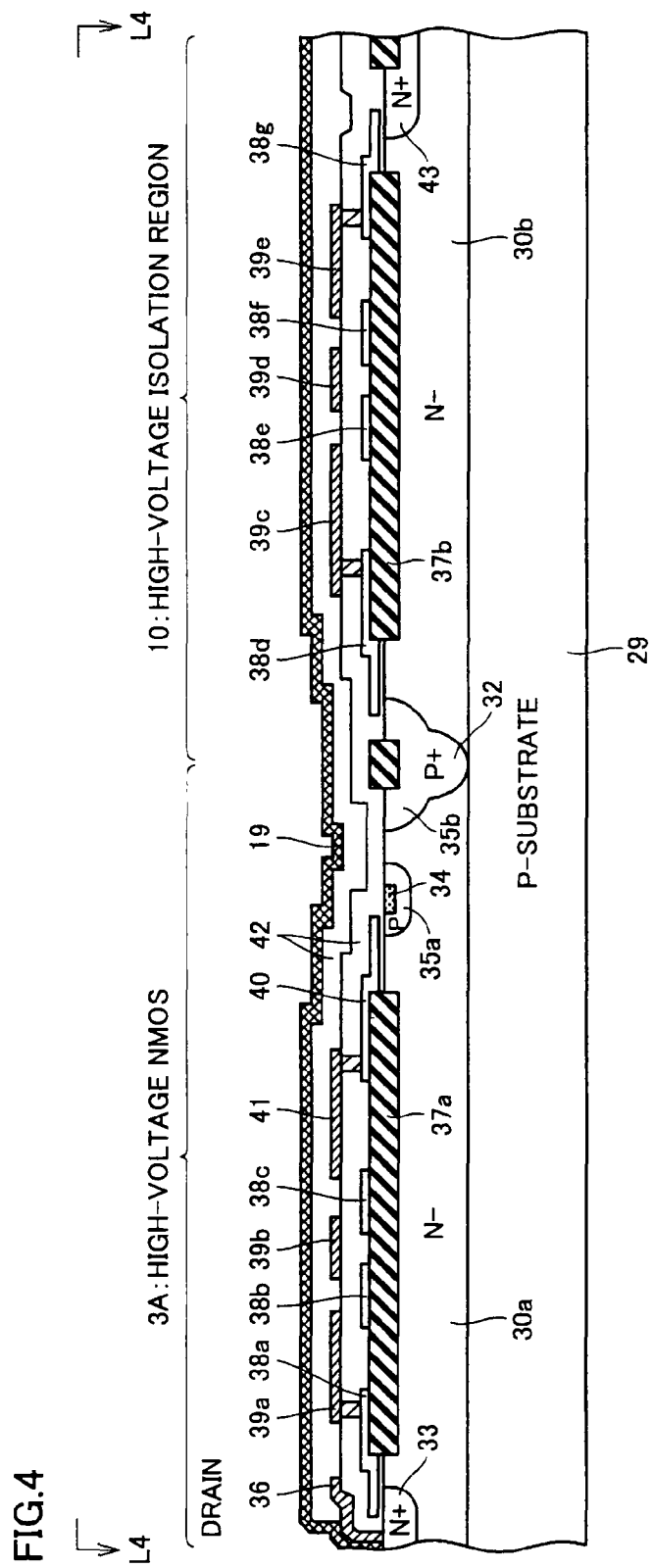
FIGS. 4, 5, 6 and 7 are schematic sectional views of the configuration of the semiconductor device of FIG. 3 taken along lines L4-L4, L5-L5, L6-L6, and L7-L7, respectively.

Referring to the sectional view of the semiconductor device of FIG. 4 taken along line L4-L4 in FIG. 3, high-voltage control circuit HVIC is formed on a P type semiconductor substrate (semiconductor substrate region) 29. N type semiconductor layers 30a and 30b are formed at the surface of P type semiconductor substrate 29. N type semiconductor layers 30a and 30b each are a semiconductor layer of high-voltage having a RESURF (Reduced Surface Field) configuration, formed by epitaxial growth, for example.

N type semiconductor layers 30a and 30b are isolated by a P type impurity region 32 of high concentration formed to reach P type semiconductor substrate 29 from the surface of the N type semiconductor layer. An N type drain impurity region 33 and a P type impurity region 35a are arranged spaced apart from each other, at the surface of N type semiconductor layer 30a. A first drain electrode interconnection 36 formed of aluminium, for example, is connected to drain impurity region 33. Drain impurity region 33 is provided to prevent first drain electrode interconnection 36 from establishing contact with the depletion layer generated at N type semiconductor layer 30a, and to reduce the contact resistance for drain electrode interconnection 36.

An element isolation film 37a formed of a local oxidation film (LOCOS film), for example, is provided at the surface of N type semiconductor layer 30a between impurity regions 33 and 35a. An N type impurity region 34 is formed at the surface of N type impurity region 35. N type impurity region 34 constitutes the source region of high-voltage N channel MOS transistor 3A.

Polysilicon gate films 38a-38c are arranged, spaced apart from each other, on element isolation film 37a. Polysilicon gate film 38a extends from above element isolation film 37a to as far as above drain impurity region 33, and is also electrically coupled to metal interconnection 39a located above. Metal interconnection 39a and polysilicon gate film 38a function as field plates to suppress a high electric field in the proximity of drain impurity region 33. Similarly, polysilicon gate films 38b and 38c function as field plates, maintained at a floating state. By the capacitive coupling thereof, the surface electric field below element isolation film 37a is rendered stable to ensure the spread of a depletion layer when high-voltage N channel MOSFET 3A is OFF.

Level shift interconnection 19 is formed to establish connection on a first drain electrode interconnection 36. This level shift interconnection 19 is arranged to extend continuously rightward in the drawings from drain impurity region 33, beyond high-voltage isolation region 10 to reach the high-side logic circuit shown in FIG. 3. When high-voltage N channel MOSFET 3A is ON, the drain current flows through level shift interconnection 19 to the impurity region at the high-side logic circuit not shown. A gate signal of a low voltage level is level-shifted by the voltage drop caused by the diffusion resistance of this impurity region to be converted into a gate signal of high voltage.

Metal interconnection 39b formed below level shift interconnection 19 functions as a shield line to prevent the signal delivered through level shift interconnection 19 from adversely affecting the depletion layer formed below element isolation film 37a.

On the surface of P type impurity region 35a, a gate electrode interconnection 40 is formed with a gate insulation film (not shown) thereunder. Gate electrode interconnection 40 is electrically coupled with metal interconnection 41 above element isolation film 37a. A control signal (gate signal) from a processor not shown is transmitted to metal interconnection 41. In accordance with this gate signal, a channel is formed selectively at the surface of P type impurity region 35a, whereby source impurity region 34 is electrically coupled to N type semiconductor layer 30a. Electrons flow from source impurity region 34 towards drain impurity region 33 via N type semiconductor layer (drift layer) 30a.

Gate electrode interconnection 41 also functions at a shield line for level shift interconnection 19. Gate electrode interconnection 40 is formed to extend to as far as above element isolation film 37a, and functions as a field plate.

An interlayer insulation film 42 is provided between level shift interconnection 19 and metal interconnections 39a-39b, as well as metal interconnection 41. An interlayer insulation film 42 is also provided between metal interconnections 39a-39b, as well as metal interconnection 41 and polysilicon gate films 38a-38c as well as gate electrode interconnection 40 to electrically isolate each interconnection.

An element isolation film 37b is formed at the surface of N type semiconductor layer 30b. Further, an N type impurity region 43 is provided at the surface of N type semiconductor layer 30b, at a region opposite to P type impurity region 32 for isolation with respect to element isolation film 37b. A bootstrap power supply voltage VB is supplied to N type impurity region 43, as will be described afterwards. By supplying bootstrap power supply voltage VB from N type impurity region 43 to N type semiconductor layer 30b, the PN junction between P type impurity region 32 and N type semiconductor layer 31b is set in a reverse-bias state. By the RESURF configuration thereof, high-voltage N channel MOSFET 3A is isolated from the transistors in the high-side logic circuit formed at the high-voltage potential island.

Gate electrode interconnections 38d-38g functioning as field plates are provided on the surface of element isolation film 37b. Polysilicon gate films 38d and 38g are electrically coupled to metal interconnections 39c and 39e, respectively, located above. Polysilicon gate films 38d and 38g are formed extending to as far as the surface of P type impurity region 32 and N type impurity region 43, respectively, to alleviate a high electric field at this region, and to ensure the formation of a depletion layer. Polysilicon gate films 38e and 38f each attain a floating state to reliably form a depletion layer below element isolation film 37b by the capacitive coupling. Metal interconnections 39c-39e function as shield lines to suppress the high voltage of level shift interconnection 19 from adversely affecting the field plate function of gate electrode interconnections 38d-38g.

By virtue of N type semiconductor layers 30a and 30b taking a RESURF configuration, a depletion layer is formed throughout N type semiconductor layers 30a and 30b (when the transistor is OFF) to implement a high-voltage configuration.

Figure 5:
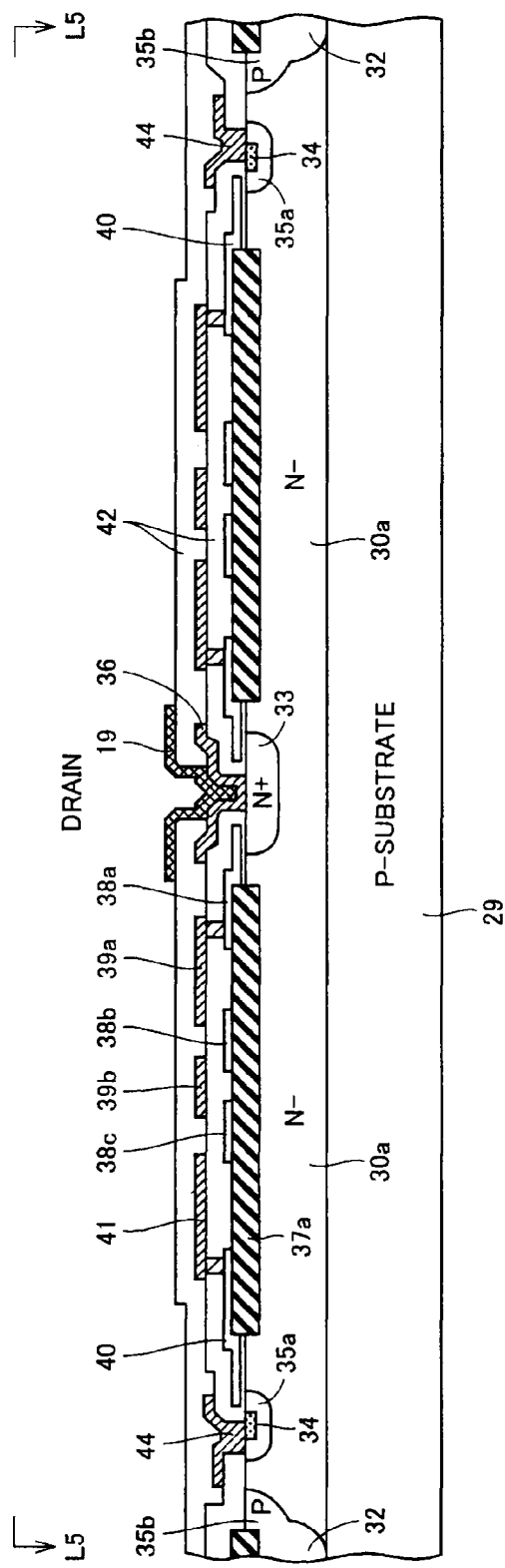

FIG. 5 represents a sectional configuration of the high-voltage N channel MOS transistor (3A) of FIG. 4, taken along line L5-L5 of FIG. 3. In FIG. 5, elements corresponding to those of high-voltage N channel MOS transistor 3A in FIG. 4 have the same reference characters allotted, and detailed description thereof will not be repeated.

Referring to FIG. 5, at the central region, a drain impurity region 33 is formed at the surface of N type semiconductor layer 30a. N type semiconductor layer 30a is formed on P type semiconductor substrate 29. A first drain electrode interconnection 36 is electrically connected to drain impurity region 33. First drain electrode interconnection 36 is electrically connected to level shift interconnection 19 formed of the second metal interconnection.

An annular element isolation film 37a is formed so as to surround drain impurity region 33. Since N channel MOSFET 3A is formed concentrically about drain impurity region 33, as shown in FIG. 3, the reference characters are allotted mainly to the region leftward of drain impurity region 33 in FIG. 5. Each element is formed concentrically about drain impurity region 33 in FIG. 5.

Polysilicon gate films 38a-38c and a portion of gate electrode interconnection 40 are formed spaced apart, on element isolation film 37a, to function as field plates. Gate electrode interconnection 40 is formed extending to as far as above the surface of P type impurity region 35a formed on N type semiconductor layer 30a. N type impurity region 34 is formed at the surface of P type impurity region 35a. A source electrode interconnection 44 is formed so as to be electrically connected to both P type impurity region 35a and N type impurity region 34. Accordingly, source impurity region 34 and P type impurity region 35a that becomes the substrate region (backgate) of MOSFET 3A are set at the same potential.

A P type impurity region 32 for isolation is formed adjacent to P type impurity region 35a. A P type impurity region 35b is formed at the surface of P type impurity region 32. The formation region for high-voltage N channel MOSFET 3A is electrically isolated from other circuit elements by a PN diode structure formed of P type impurity region 32 and P type impurity region 35b and N type semiconductor layer 30a. When MOSFET 3A is OFF, the PN junction takes an reverse-biased state, and a depletion layer is formed at N type semiconductor layer 30a (high voltage VB is transmitted by level shift interconnection 19, and ground voltage GND is supplied to P type semiconductor substrate 29).

By an aluminium interconnection, for example, of an interconnection layer identical to source electrode interconnection 44, electrode interconnection 41 and shield metal interconnections 39a and 39b are formed above element isolation film 37a. Electrode interconnection 41 is electrically connected to gate electrode interconnection 40. These impurity regions and each conductor layer (metal interconnection, gate electrode interconnection, and polysilicon film) are isolated by an interlayer insulation film 42.

Source electrode interconnection 44 is formed annularly. When MOSFET 3A is ON, the electrons introduced from the source region (source impurity region 34) move towards drain impurity region 33 via the channel formed at the surface of P type impurity region 35a and N type semiconductor layer 30a.

By the configuration of polysilicon gate films 38a-38c and gate electrode interconnection 40 functioning as field plates in the configuration of FIG. 5, a high-voltage configuration is realized when the transistor is OFF (N type semiconductor layer 30a can be set to a RESURF configuration). Electrode interconnection 38a is formed on the surface of N type semiconductor layer 30a and above element isolation film 37a, allowing the high electric field at the drain to be alleviated when the transistor is ON.

Figure 6:
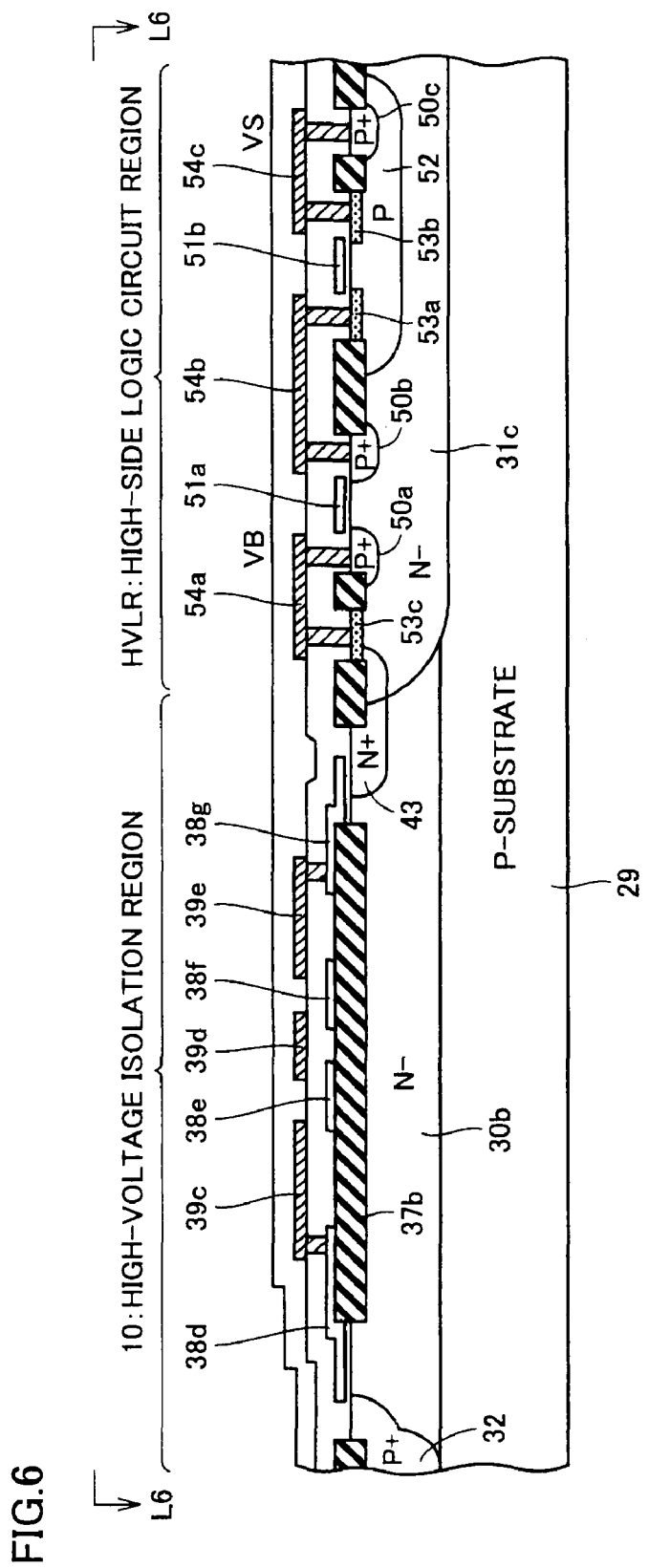

In the schematic sectional view of the semiconductor device of FIG. 6 taken along line L6-L6 of FIG. 3, the elements of high-voltage isolation region 10 have a configuration identical to that of the high-voltage isolation region of FIG. 4. Corresponding elements have the same reference characters allotted, and detailed description thereof is not repeated.

At high-side logic circuit formation region HVLR, an N type semiconductor layer 31c is formed adjacent to N type semiconductor layer 30b. N type impurity region 43 formed at the surface of N type semiconductor layer 30b at the end of high-voltage isolation region 10 is arranged extending to as far as above N type semiconductor layer 31c. This N type semiconductor layer 31c constitutes a substrate region of high-side logic circuit formation region HVLR, not taking a RESURF configuration, and receives a high bootstrap voltage VB.

An N type impurity region 53c is formed at the surface of N type semiconductor layer 31c so as to contact both of N type impurity region 43 and N type semiconductor layer 31c. Further, P type impurity regions 50a and 50b are formed spaced apart. N type impurity region 53c and P type impurity region 50a are isolated from each other by an element isolation region. A P type well region 52 is formed at the surface of N type semiconductor layer 31c, apart from P type impurity region 50b via an element isolation region therebetween. N type impurity regions 53a and 53b are formed spaced apart from each other at the surface of P type well region 52. A P type impurity region 50c is formed at the surface of P type well region 52, isolated from N type impurity region 53b by an element isolation region.

A gate electrode 51a is formed on the surface of N type semiconductor layer 31c, between P type impurity regions 50a and 50b. P type impurity region 50a is electrically connected to N type impurity region 53c via metal interconnection 54a. By gate electrode interconnection 51a and P type impurity regions 50a and 50b, a P channel MOS transistor (insulated gate field effect transistor) is formed. Bootstrap power supply voltage VB is transmitted to metal interconnection 54a. This bootstrap power supply voltage VB is transmitted to semiconductor layers 30b and 31c via N type impurity regions 53c and 43, respectively.

A gate electrode 51b is formed on the surface of P type well region 52 between N impurity regions 53a and 53b with a gate insulation film not shown thereunder. N type impurity regions 53a and 53b and gate electrode 51b constitute an N channel MOS transistor. N type impurity region 53a is coupled to P type impurity region 50b via metal interconnection 54b. N type impurity region 53b is coupled to P type impurity region 50c via metal interconnection 54c. Metal interconnection 54c is coupled to virtual ground pad 11 shown in FIG. 3. P type well region 52 is biased to virtual ground potential VS via P type impurity region 50c.

At high-side logic circuit formation region HVLR, an inverter is formed by a P channel MOS transistor and an N channel MOS transistor. In accordance with a level-shifted signal applied to gate electrode interconnections 51a and 51b, a control signal of the level of bootstrap high voltage VB or virtual ground potential VS is output.

Even if bootstrap power supply voltage VB of a high voltage level is transmitted to N type semiconductor layer 30b, a depletion layer spreads throughout N type semiconductor layer 30b due to the PN junction between P type impurity region 32 and N type semiconductor layer 30b in a reverse-bias state. A RESURF configuration of high voltage is realized.

Figure 7:
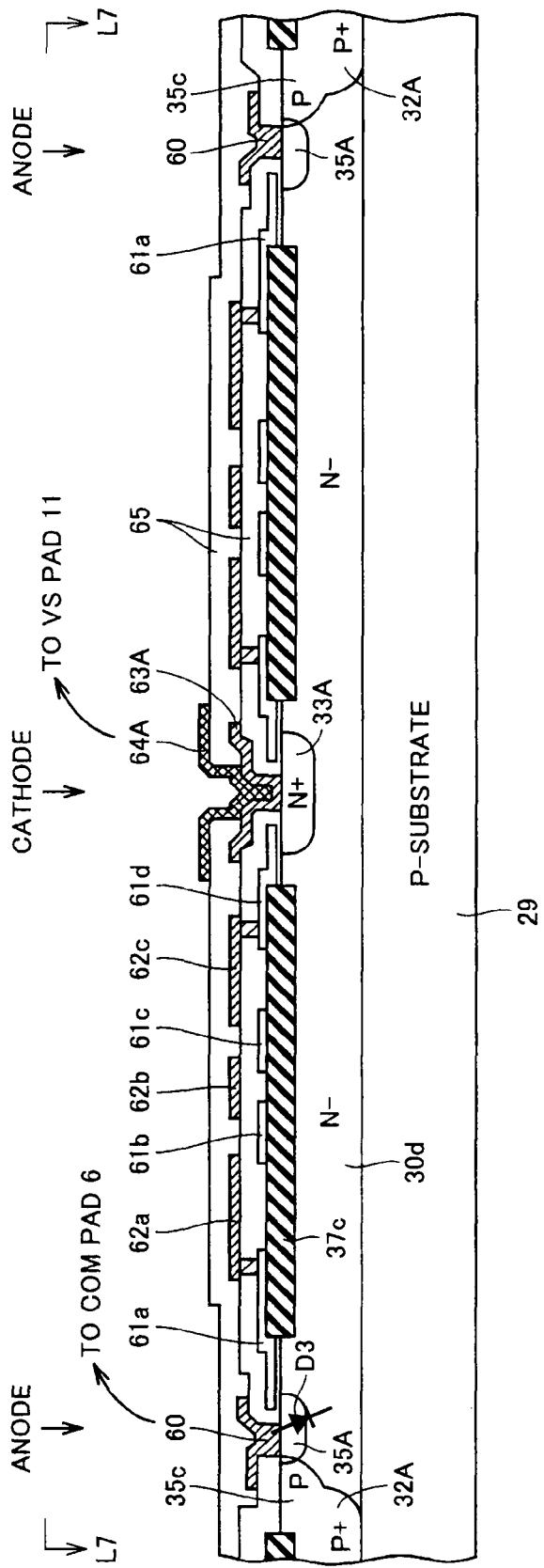

FIG. 7 represents a sectional configuration of high-voltage diode D3 for clamping according to the first embodiment, taken along line L7-L7 of FIG. 3. Referring to FIG. 7, the high-voltage diode (D3) is formed on P type semiconductor substrate 29, likewise with high-voltage N channel MOSFETs 3A and 3B. An N type semiconductor layer 30d is formed at the surface of P type semiconductor substrate 29. A P type impurity region 32A is formed to surround N type semiconductor layer 30d. P type impurity region 35c is formed at the surface of P type impurity region 32A which extends as far as to semiconductor substrate 29. N type semiconductor layer 30d is isolated from the elements of other regions by P type isolation region (P type impurity region) 32A and P type impurity region 35c formed at the surface thereof.

A P type impurity region 35A is formed at the surface of N type semiconductor layer 30d, adjacent to P type impurity region 35c. An anode electrode interconnection 60 is formed in contact with P type impurity region 35A. An element isolation region 37c is formed at the surface of N type semiconductor layer 30d, between impurity regions 35A and 33A. An N type impurity region 33A is formed opposite to P type impurity region 35A with respect to element isolation region 37c. N type impurity region 33A is formed at the central region of diode formation region 4 (diode element D3). P type impurity region 35A is formed annularly and concentric with N type impurity region 33A. An electrode interconnection 63A is formed in contact with N type impurity region 33A. A metal interconnection 64A is formed to be electrically connected with electrode interconnection 63A. Metal interconnection 64A and electrode interconnection 63A constitute the cathode electrode of the high-voltage diode.

Polysilicon gate films 61a-61d are formed concentrically about impurity region 33A on element isolation film 31d to function as field plates. Polysilicon gate films 61a and 61d are electrically connected to metal interconnections 62a and 62c, respectively. Each of polysilicon gate films 61b and 6c is set at a floating state, having a metal interconnection 62b formed thereon.

Anode electrode interconnection 60 receives common ground voltage GND via common ground node COM. Polysilicon gate film 61a identified as a gate electrode interconnection is set a floating state. Polysilicon gate film 61a merely functions as a field plate.

N type semiconductor layer 30d has a RESURF configuration, taking a high-voltage structure. N type impurity region 33A reduces the contact resistance for cathode electrode 63A, and prevents the depletion layer formed at N type semiconductor layer 31d from directly contacting cathode electrode interconnection 63A. P type impurity region 35A is of high concentration, reducing the contact resistance for anode electrode interconnection 60, and forms a PN junction of a high-voltage PN diode. At this diode formation region 4, each electrode interconnection, polysilicon film, and impurity region are isolated by interlayer insulation film 65.

As shown in FIG. 3, cathode electrode interconnection 64A extends beyond high-voltage isolation region 10 to be electrically connected with a virtual ground potential pad 11 located at high-side logic circuit formation region HVLR to receive virtual ground potential VS. Anode electrode interconnection 60 is coupled with pad 6 that is coupled with common ground node COM arranged in the proximity of diode formation region 4, as shown in FIG. 3.

By means of the interconnection in high-voltage control circuit HVIC, a high-voltage PN diode is connected across terminals COM and VS to sufficiently reduce the parasitic inductance component at the interconnection of diode connection to ensure reduction of potential VS of the cathode.

As shown in FIG. 3, high-voltage diode D3 is located between the low-side logic circuit and high-voltage potential island region 9, in close arrangement, likewise with high-voltage N channel MOSFETs 3A and 3B. Therefore, increase in the layout area of high-voltage control circuit HVIC is suppressed. At the same fabrication step, P type impurity region 35A constituting an anode is formed based on steps similar to those for forming the source region of the other N channel MOSFETs for level shifting, provided that the N type impurity region qualified as a source impurity region is not formed at the surface of P type impurity region 35A in the diode region. Therefore, a high-voltage diode can be formed according to fabrication steps substantially similar to those of N channel MOSFETs 3A and 3B for level shifting.

According to the first embodiment of the present invention, a high-voltage diode for suppressing undershooting at the virtual ground potential node is provided in the high-voltage control circuit (IC) to reduce the parasitic inductance component, which in turn allows the VS undershooting component to be suppressed. Thus, a control circuit (power device driving circuit) that can control the ON/OFF of the power transistor stably and speedily can be realized.

Second Embodiment

Figure 8:
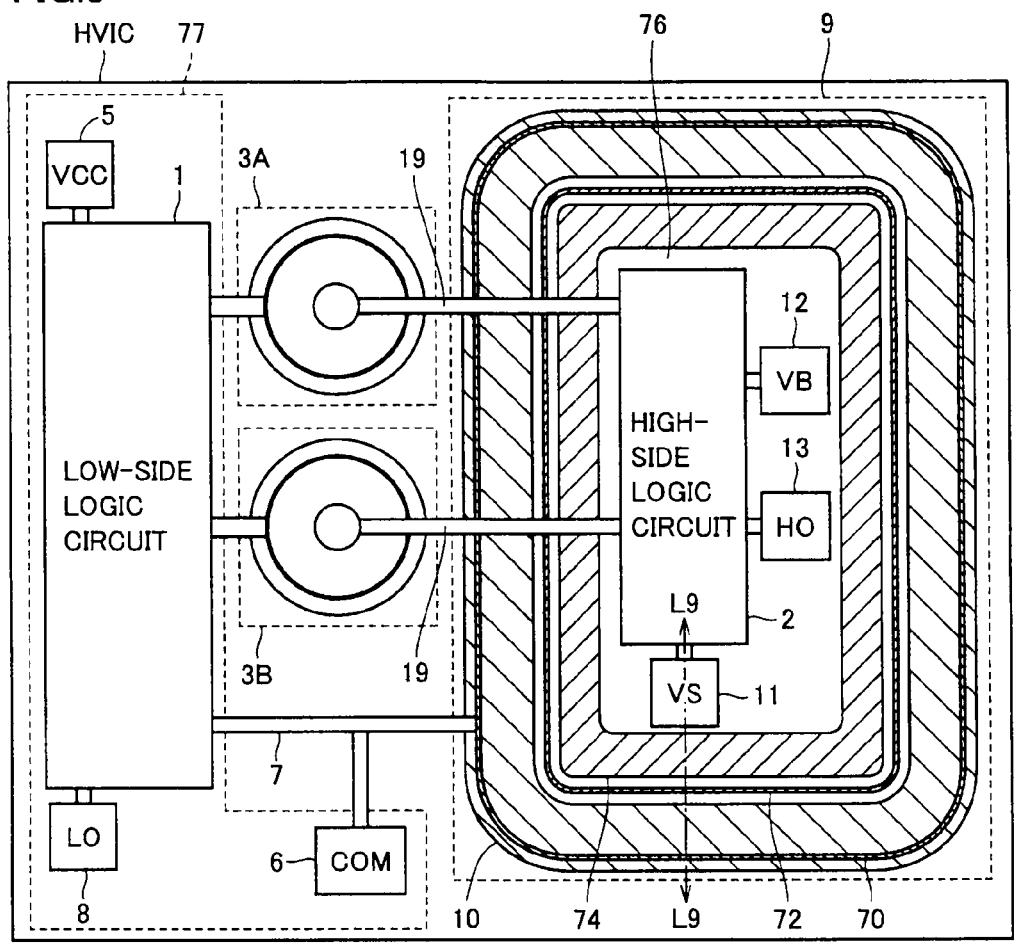
FIG. 8 schematically represents a plan layout of a semiconductor device according to a second embodiment of the present invention.

FIG. 8 schematically shows a plan layout of a high-voltage control circuit HVIC according to the second embodiment of the present invention. In the configuration of high-voltage control circuit HVIC shown in FIG. 8, a high-voltage diode for VS clamping is formed taking advantage of high-voltage isolation region 10 located in high-voltage potential island region 9 where high-side logic circuit 2 is formed. Specifically, in high-voltage isolation region 10, an anode electrode 70 of high-voltage diode D3 for clamping is formed extending continuously along the entire perimeter of high-voltage isolation region 10 to take a track-like shape. A cathode electrode 72 is formed continuously in a track-like shape within high-voltage isolation region 10. A slit region 74 is located between cathode electrode 72 and high-side logic circuit region 76. By this slit region 74, the N type semiconductor layer constituting high-voltage diode D3 and the N type semiconductor layer constituting high-side logic circuit 2 are isolated.

Anode electrode 70 is coupled to common ground pad 6 via internal interconnection 7 to receive common ground potential GND from common ground node COM. Cathode electrode 72 is coupled to the impurity region that supplies to high potential island region 9 bootstrap power supply voltage VB provided at high-side logic circuit formation region 76, as will be described afterwards.

The remaining configuration of high-voltage control circuit HVIC shown in FIG. 8 is similar to that of high-voltage control circuit HVIC shown in FIG. 3. Corresponding elements have the same reference characters allotted, and detailed description thereof will not be repeated.

As shown in FIG. 8, a high-voltage diode for VS clamping (to prevent VS undershooting) is formed utilizing isolation region 10 in high potential island region 9. Accordingly, an additional area for the clamping high-voltage diode is not necessary, allowing the layout area of high-voltage control circuit HVIC to be reduced.

Since high-voltage diode D3 is formed taking advantage of high-voltage isolation region 10, the layout size therefore can be increased to achieve a current supply capability (conducting performance) of a sufficient level to ensure the clamping operation at the time of negative surge input.

Figure 9:
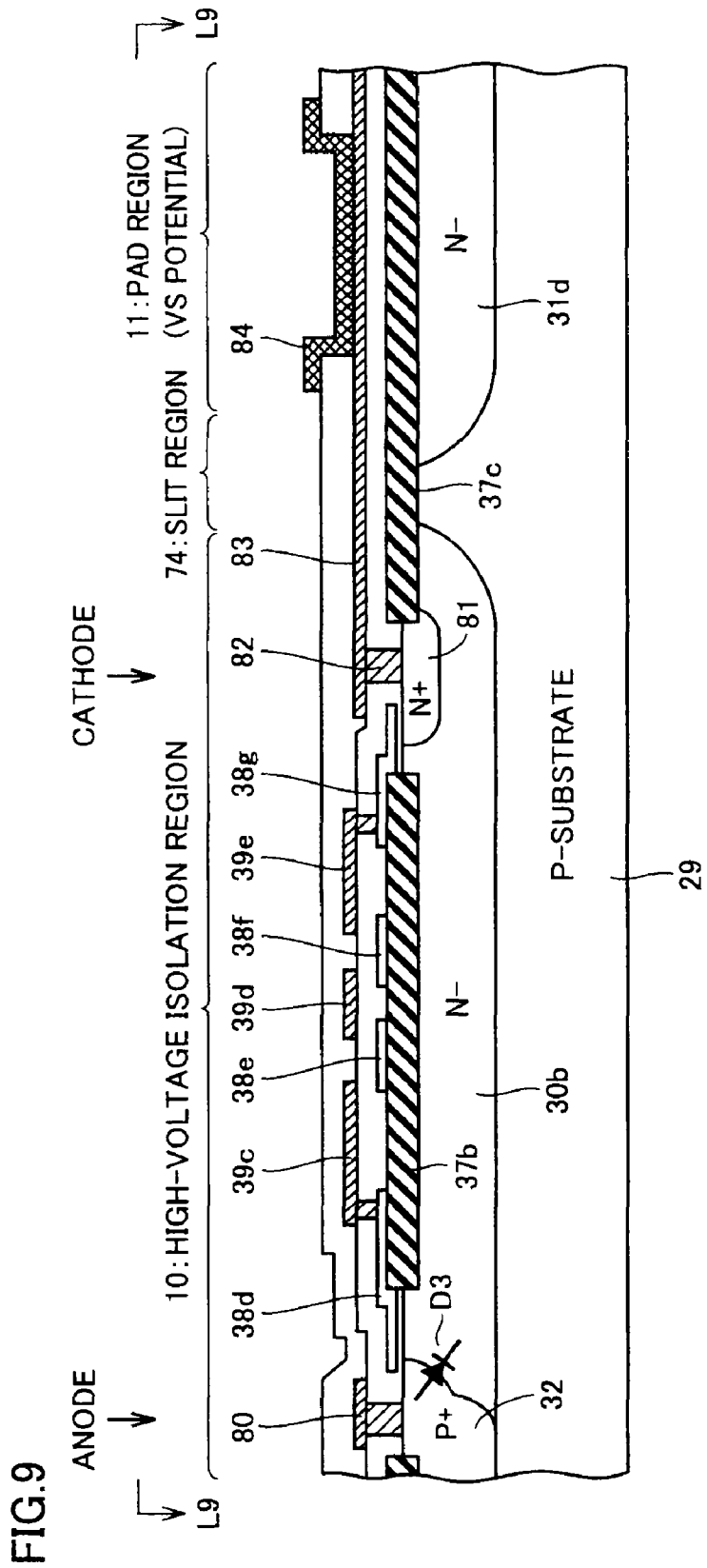
FIG. 9 is a schematic sectional view of the configuration of the semiconductor device of FIG. 8 taken along line L9-L9.

FIG. 9 schematically shows a sectional configuration taken along line L9-L9 of FIG. 8. Referring to FIG. 9, high-voltage isolation region 10 includes N type semiconductor layer 30b formed at the surface of P type semiconductor substrate 29. High-voltage isolation region 10 has anode electrode interconnection 80 electrically connected with respect to P type isolation region (P type impurity region for isolation) 32, likewise with the configuration shown in FIG. 6. P type isolation region 32 has impurities of high concentration introduced even at the surface region, reducing the contact resistance with respect to anode electrode interconnection 80, and prevents the depletion layer from contacting anode electrode interconnection 80.

Element isolation film 37b is formed on the surface of N type semiconductor layer 30b. On element isolation film 37b, polysilicon gate films 38d-38g functioning as field plates are formed spaced apart. Polysilicon gate films 38d and 38g are electrically connected with electrode interconnections 39c and 39e, respectively, functioning as field plates, and alleviating the high electric field in the proximity of impurity regions 32 and 81.

N type impurity region 81 of high concentration is formed at the surface of N type semiconductor layer 30b, opposite to P type isolation region 32 with respect to element isolation film 37b. A cathode electrode interconnection 82 is formed to be electrically connected to N type impurity region 81. Cathode electrode interconnection 82 is also electrically connected with second metal electrode interconnection 83. Second metal electrode interconnection 83 is arranged extending to as far as the pad region where pad 11 is formed, across and above element isolation film 37c, and is electrically connected with electrode interconnection 84 of pad 11.

Pad electrode interconnection 84 constitutes pad 11, and receives virtual ground potential VS. N type semiconductor layer 30b takes a RESURF configuration. P type impurity region 32 and N type semiconductor layer 30b constitute a high-voltage PN diode.

N type semiconductor layer 31d constituting high-voltage potential island region 9 is arranged isolated from N type semiconductor layer 30b of high-voltage isolation region 10 by slit region 74.

N type semiconductor layer 31d receives power supply voltage VB of the high-side logic circuit whereas N type semiconductor layer 30b receives virtual ground potential VS via pad 11, as described in the first embodiment. By providing slit region 74, N type semiconductor layer 31d to which high voltage VB is applied can be electrically isolated from N type semiconductor layer 30b to which virtual ground potential VS is applied, allowing individual supply of voltages VB and VS. Thus, a high-voltage diode for VS clamping can be arranged utilizing high-voltage isolation region 10, allowing the layout area of high-voltage control circuit HVIC to be reduced.

P type isolation region 32 and N type semiconductor layer 30b are formed in a track-like shape to surround high-side logic circuit region 74, as shown in FIG. 8. The size thereof can be set sufficiently large to have sufficient current supply capability. Undershooting of potential VS at pad 11 can be absorbed at high speed.

Third Embodiment

Figure 10:
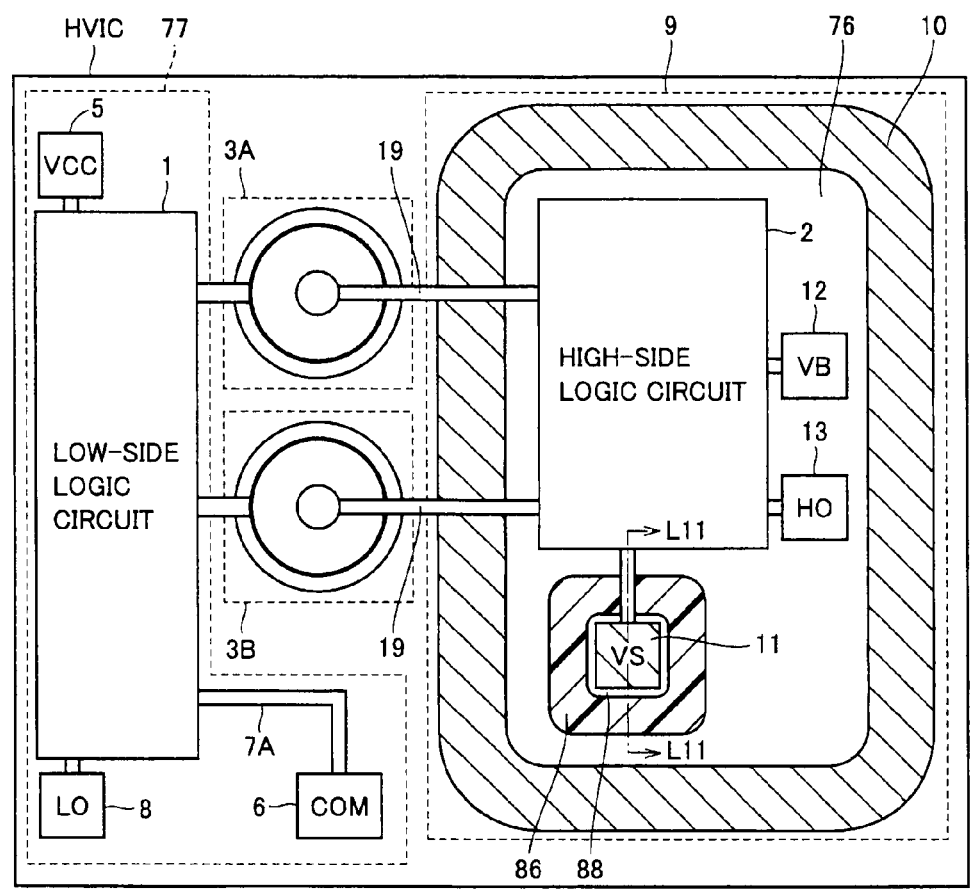
FIG. 10 schematically represents a plan layout of a semiconductor device according to a third embodiment of the present invention.

FIG. 10 schematically represents a plan layout of a high-voltage control circuit HVIC according to a third embodiment of the present invention. At high-voltage control circuit HVIC of FIG. 10, common ground pad 6 coupled to common ground node COM is connected to low-side logic circuit 1 via internal interconnection 7A. Ground voltage GND from common ground node COM is supplied to P type semiconductor substrate 29 where high-voltage control circuit HVIC is formed.

The high-voltage diode for VS clamping is formed at virtual ground potential pad 11 that supplies virtual ground voltage VS. Cathode electrode region 88 is formed at this virtual ground potential pad 11. A slit region 86 is formed at the outer perimeter of cathode electrode region 88 to isolate the N type impurity region to which virtual ground pad 11 is coupled from the N type semiconductor layer constituting the substrate region for high-side logic circuit formation region 76 (high-voltage potential island region 9). The remaining configuration of high-voltage control circuit HVIC of FIG. 10 is similar to that of high-voltage control circuit HVIC of FIG. 8. Corresponding elements have the same reference characters allotted, and detailed description thereof will not be repeated.

A slit region 86 is provided to surround the high-voltage diode at high-side logic circuit formation region 76. Accordingly, the N type impurity region to which the cathode of the high-voltage diode for clamping is connected and the N type semiconductor layer constituting the substrate region for high-side logic circuit region 76 are electrically isolated to allow individual supply of a voltage.

Figure 11:
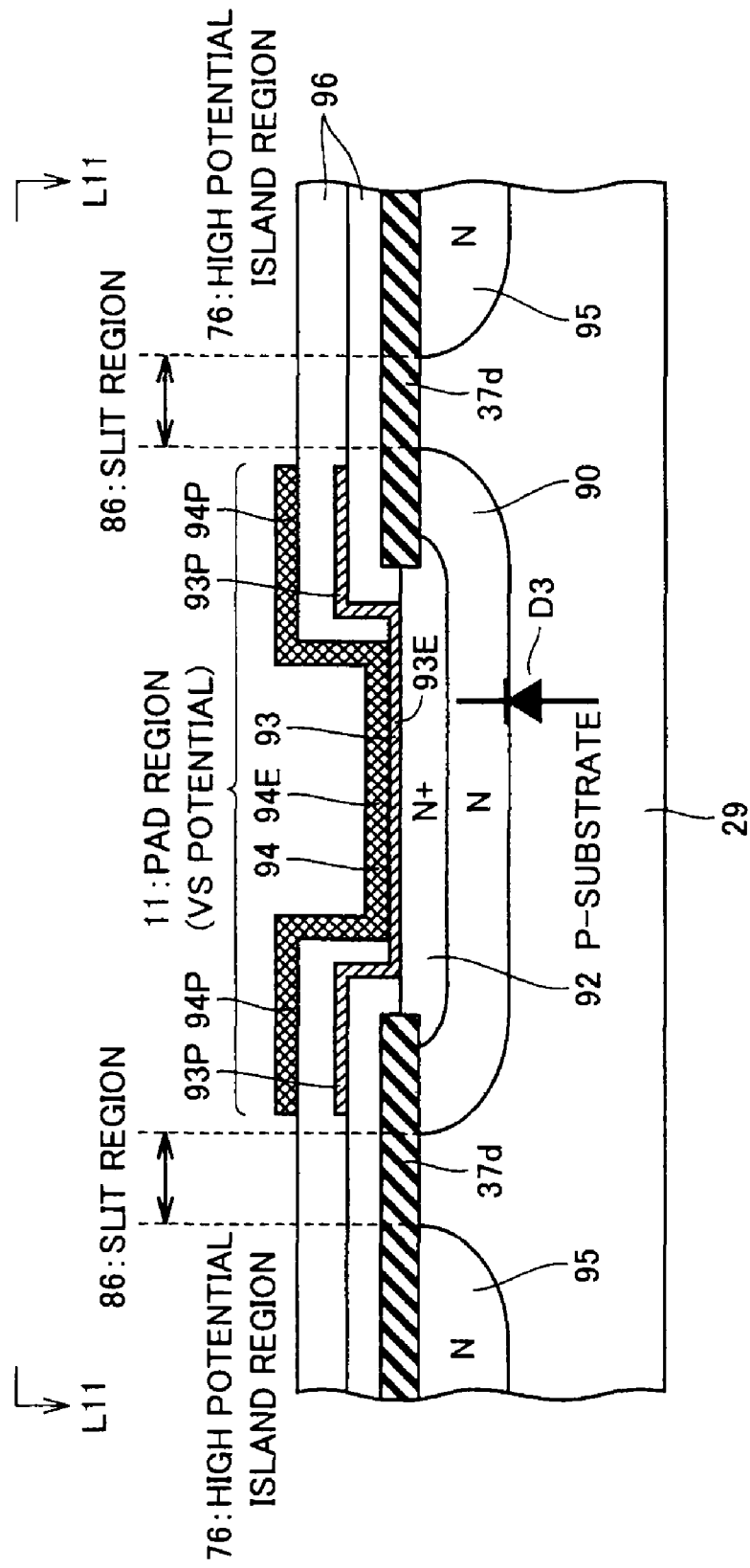
FIG. 11 is a schematic sectional view of the configuration of the semiconductor device of FIG. 10 taken along line L11-L11.

FIG. 11 is a schematic sectional view of a configuration of a semiconductor device taken along line L11-L11 of FIG. 10. At the region where pad 11 is arranged in FIG. 11, N type impurity region 90 is formed at the surface of P type semiconductor substrate 29, and an N type impurity region 92 of high concentration is formed at the surface of N type impurity region 90. A first electrode interconnection 93 is formed on the surface of N type impurity region 92 so as to be electrically connected. A second electrode interconnection 94 is provided on first electrode interconnection 93, achieving electrical connection therebetween. Electrode interconnections 93 and 94 constitute pad 11, and also the cathode electrode of high-voltage diode D3, and are connected to a lead or the like via a bonding wire. N type impurity region 92 is provided to reduce the contact resistance with respect to first electrode interconnection 93.

A high-voltage diode is formed by the PN junction between N type impurity region 90 and P type semiconductor substrate 29. N type semiconductor layer 95 is provided on P type semiconductor substrate 29, isolated from N type impurity region 90 by slit region 86. This N type semiconductor layer 95 is utilized as a substrate region for forming a P type transistor at high potential island region 9, having high voltage VB applied as the substrate bias voltage. The provision of slit region 86 allows voltage VS and voltage VB to be supplied individually to N type impurity regions 90 and 95. Specifically, by surrounding N type semiconductor layer 90 by means of slit region 86, N type semiconductor layers 90 and 95 can be electrically isolated by the PN junction isolation between P type semiconductor substrate 29 and N type semiconductor layers 90 and 95.

As shown in FIG. 11, an N type impurity region 92 of high concentration is formed at the surface of N type semiconductor layer 90 in the configuration of high-voltage diode D3. N type impurity region 92 is electrically connected directly to electrode interconnections 93 and 94 constituting the pad thereabove. Therefore, the cathode electrode of high-voltage diode D3 is directly connected to a bonding wire (not shown) without the intervention of an internal interconnection, allowing the parasitic resistance to be minimized.

Element isolation film 37d is formed to surround the formation region of pad 11, and an interlayer insulation film 96 is formed thereon for the isolation of the interconnections and elements.

Electrode interconnections 93 and 94 extend to as far as above element isolation film 37d, and function as field plates at the element isolation region to suppress generation of a high electric field at the surface of N type semiconductor layer 90. Specifically, electrode interconnections 93 and 94 include electrode sections 93E and 94E formed in contact with N type impurity region 92 of high concentration, and plate sections 93P and 94P formed on N type semiconductor layer 90 with an insulation film 96 thereunder.

Electrode interconnection 94 in the region of pad 11 transmits virtual ground voltage VS into high-side logic circuit 2 via an internal interconnection, as shown in FIG. 10.

According to the third embodiment of the present invention, a high-voltage diode for VS clamping is directly formed below the virtual ground voltage pad region. Thus, the length of the interconnection for the high-voltage diode can be minimized, which in turn allows the parasitic resistance and parasitic inductance component to be reduced.

Fourth Embodiment

Figure 12:
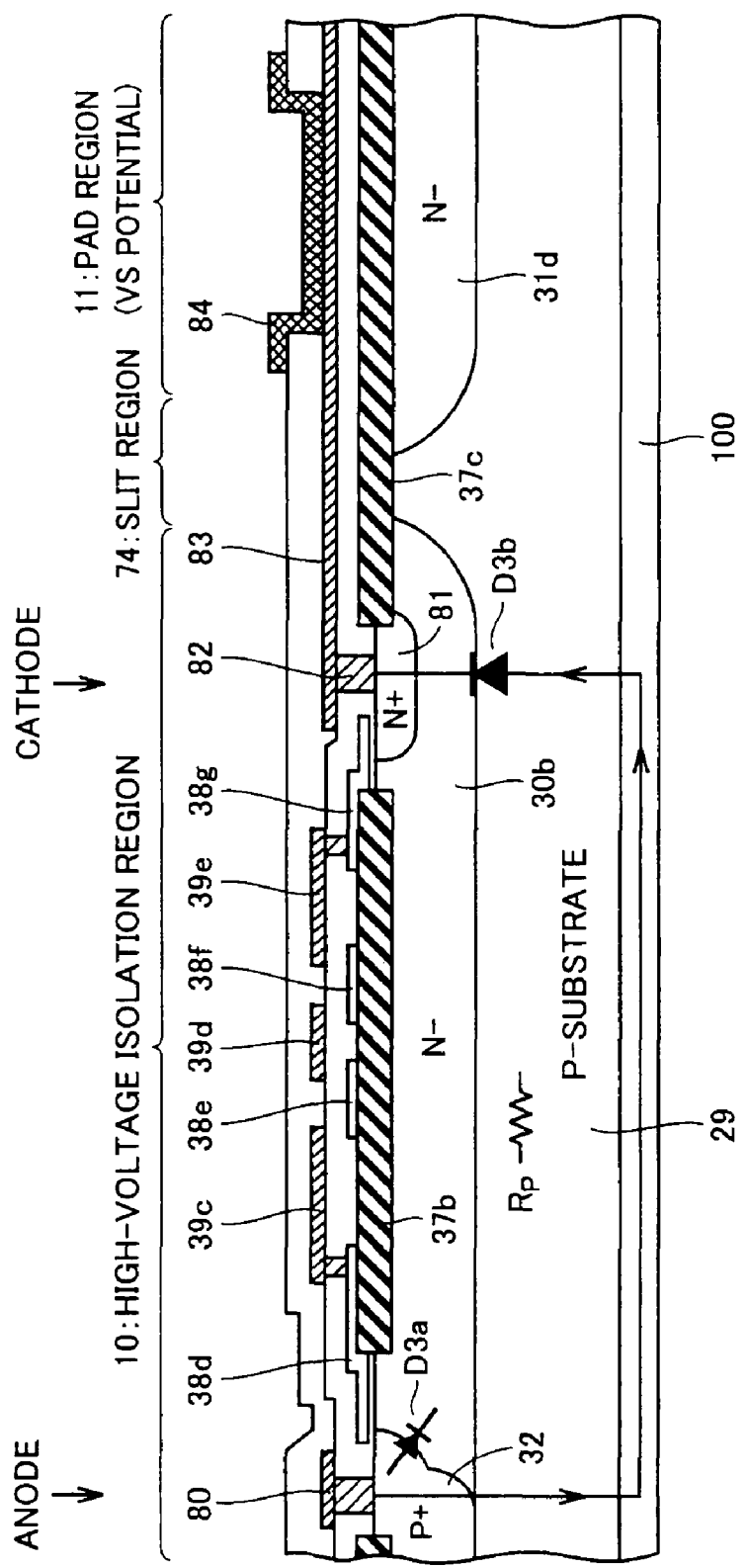
FIGS. 12 and 13 are schematic sectional views of a configuration of a high-voltage diode according to fourth and fifth embodiments, respectively, of the present invention.

FIG. 12 is a schematic sectional view of a configuration of high-voltage diode D3 according to a fourth embodiment of the present invention. The high-voltage diode of FIG. 12 differs in configuration from the high-voltage diode of FIG. 9 in that a back metal electrode 100 is formed at the backside of P type semiconductor substrate 29. The remaining configuration of the high-voltage diode of FIG. 12 is similar to that of the high-voltage diode of FIG. 9. Corresponding elements have the same reference characters allotted, and detailed description thereof will not be repeated. The plan layout of high-voltage control circuit HVIC of the fourth embodiment is identical to that shown in FIG. 8.

According to the configuration of the high-voltage diode of FIG. 12, P type isolation region 32 functions as an anode. Accordingly, P type semiconductor substrate 29 functions as an anode. P type semiconductor substrate 29 and back metal electrode 100 are electrically coupled. Therefore, the current flowing from anode electrode interconnection 80 towards P type semiconductor substrate 29 via P type isolation region 32 flows through back metal electrode 100. The current flowing through back metal electrode 100 further runs to N type impurity region 81 via N type semiconductor layer 30b, in the region below cathode electrode interconnection 82. A parallel circuit of two diodes D3a and D3b are arranged equivalently at the path where current flows, allowing the delivery of high-amperage current.

Further, the parasitic resistance component of P type semiconductor substrate 29 can be reduced by back metal electrode 100. In response, the current restriction by the parasitic resistance component of P type semiconductor substrate 29 can be suppressed to allow the supply of a high-amperage current. Thus, VS clamping at the time of negative surge input can be further ensured.

Fifth Embodiment

Figure 13:
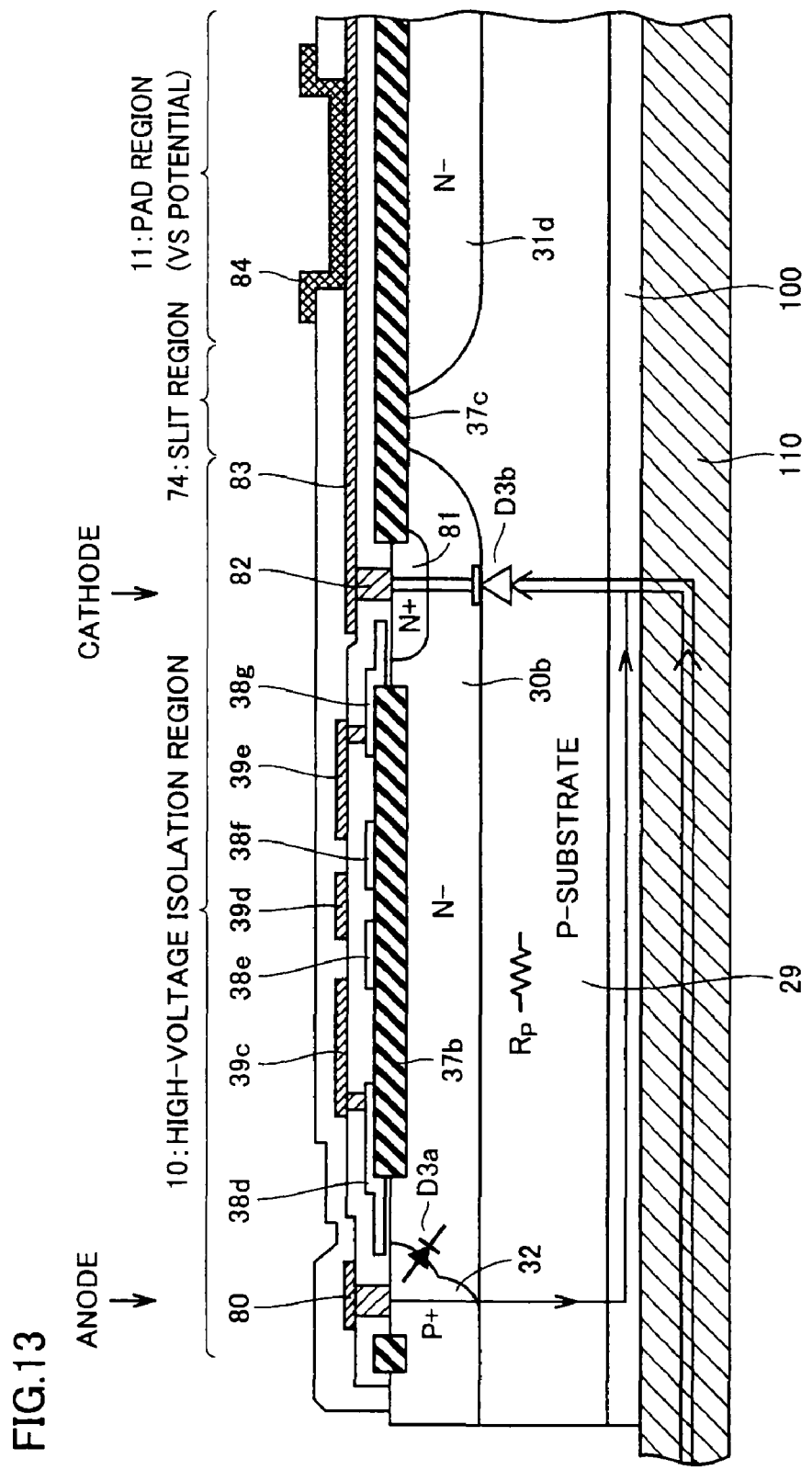

FIG. 13 is a schematic sectional view of the high-voltage diode portion in high-voltage control circuit HVIC according to a fifth embodiment of the present invention. The high-voltage diode of FIG. 13 differs in configuration from the high-voltage diode of FIG. 12 in that a metal lead frame 110 is additionally attached to back metal electrode 100 formed at the backside of P type semiconductor substrate 29. Metal lead frame 110 is connected to common ground node COM. The remaining configuration of the high-voltage diode of FIG. 13 is similar to that of the high-voltage diode of FIG. 12. Corresponding elements have the same reference characters allotted, and detailed description thereof will not be repeated.

In the diode configuration of FIG. 13, when VS undershooting occurs (at the time of negative surge input), current flows, in addition to back metal electrode 100, to cathode electrode interconnection 82 via metal lead frame 110 maintained at the level of common ground voltage (GND). Therefore, the conducting capability of high-voltage diode D3c formed between P type semiconductor substrate 29 and N type semiconductor layer 31b can be increased, as compared to the diode of FIG. 12, to reliably absorb negative surge, allowing the undershooting of virtual ground potential VS to be reduced.

Figure 14:
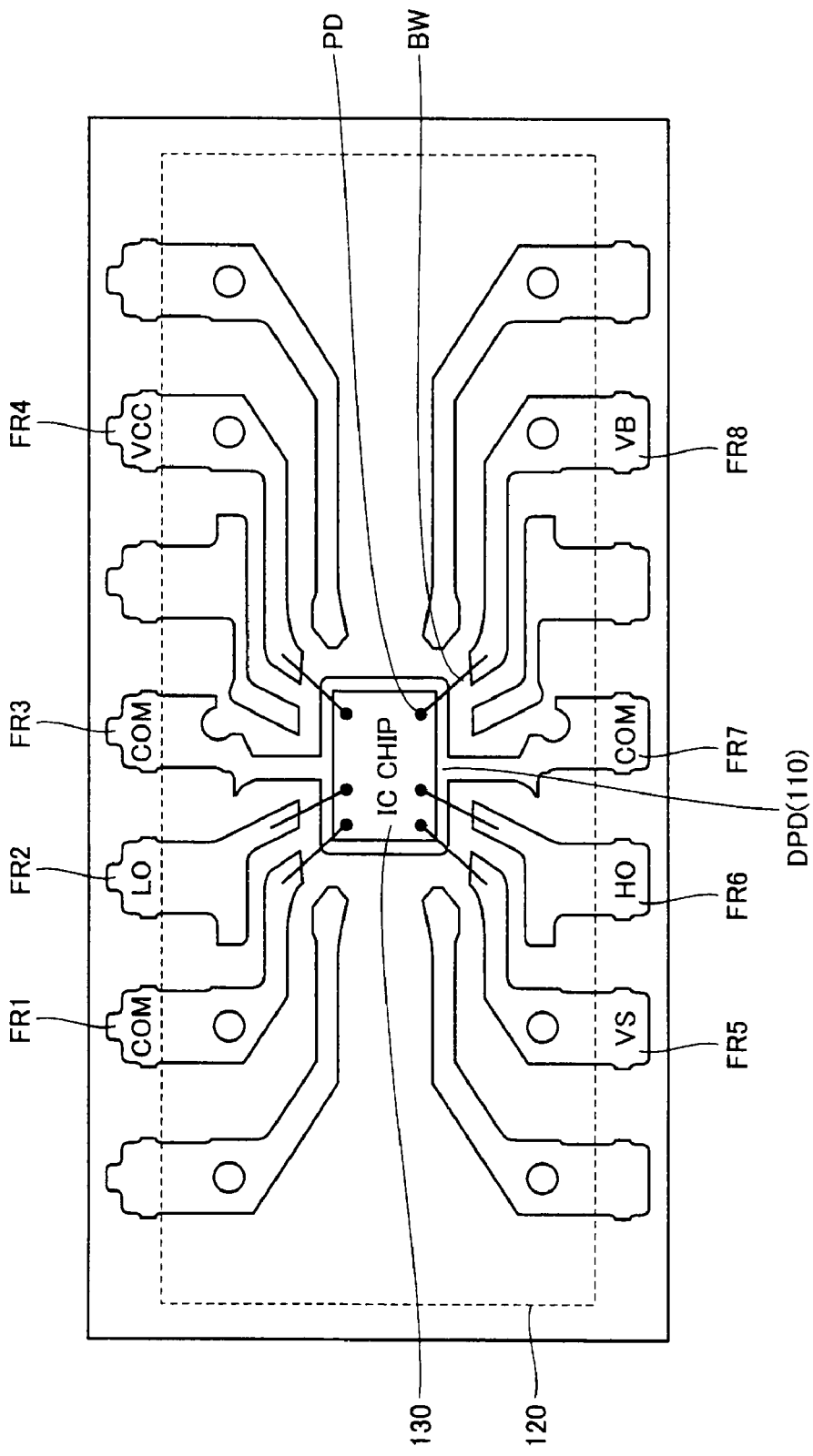
FIG. 14 schematically represents a manner of a package assembly of a semiconductor device of the fifth embodiment.

FIG. 14 schematically represents a manner of the chip assembly of the high-voltage control circuit according to the fifth embodiment of the present invention. Referring to FIG. 14, a lead frame to transmit and receive a signal/voltage between high-voltage control circuit HVIC and an external source is arranged around IC chip 130. IC chip 130 is where high-voltage control circuit HVIC is formed.

The lead frame includes leads FR1-FR4 arranged at one side of IC chip 130. Leads FR5-FR8 are arranged in alignment at the other side of IC chip 130. Leads FR1 and FR3 constitute common ground terminal COM. Lead FR2 constitutes a low side control signal output terminal LO. Lead FR4 constitutes the power supply terminal supplying power supply voltage VCC. Lead FR5 constitutes virtual ground terminal VS. Lead FR6 constitutes high side control signal output terminal HO. Lead FR7 constitutes common ground terminal COM. Lead FR8 constitutes bootstrap power supply terminal VB.

Leads FR1-FR8 have the pad section at the leading end electrically connected to pad PD formed at the surface of IC chip 130 by a bonding wire BW. IC chip 130 constitutes any of high-voltage control circuit HVIC described in the previous embodiments, and is arranged on a die pad portion DPD. This die pad portion DPD is formed integrally with or is electrically connected to leads FR3 and FR7, and shaped in a rectangular form. Die pad portion DPD corresponds to lead frame 110 shown in FIG. 13.

The reason why a through hole is formed at the lead is to reduce the parasitic inductance component to reduce the power supply noise. Lead FR1 constituting common ground terminal COM and where a through hole is provided is electrically connected to pad PD formed at the surface of IC chip 130 to stably transmit common ground potential (GND) to high-voltage control circuit HVIC.

As shown in FIG. 14, a lead for transmission and reception of a signal/voltage with respect to an external source is disposed, prior to the mounting of IC chip 130 in a package to form control circuit device 120 for driving a power transistor. Die pad portion DPD may include a configuration set forth below, by way of example. Only a lead frame transmitting a required signal/voltage with respect to control circuit device 120 is provided, and a die pad for the arrangement of a particular chip (die) is not provided. A lead frame constituting common ground terminal COM is bent at the middle portion to take a concave shape. This portion corresponds to die pad portion DPD on which IC chip 130 is mounted.

The backside of IC chip 130 is electrically connected to die pad portion DPD (110) of the lead frame via solder, for example. Therefore, as terminal COM, a lead frame is disposed throughout the entire backside of IC chip 130. The area of arrangement thereof is sufficiently large to allow a high-amperage current to flow.

As shown in FIG. 14, IC chip 130 constituting high-voltage control circuit HVIC is arranged at the lead frame in a chip assembly process. The backside of IC chip 130 is electrically connected to the lead frame (die pad portion DPD) by solder, for example. Therefore, the current supply capability of the high-voltage diode can be reliably increased without any additional element. Virtual ground voltage VS can be clamped at a predetermined potential level speedily when VS undershooting occurs.

In FIG. 14, the lead that transmits a predetermined voltage/signal is formed in a concave shape for the formation of a die pad portion. Alternatively, this lead and the die pad may be provided separately, taking a pin arrangement (lead frame) forming a thin-type package.

Sixth Embodiment

Figure 15:
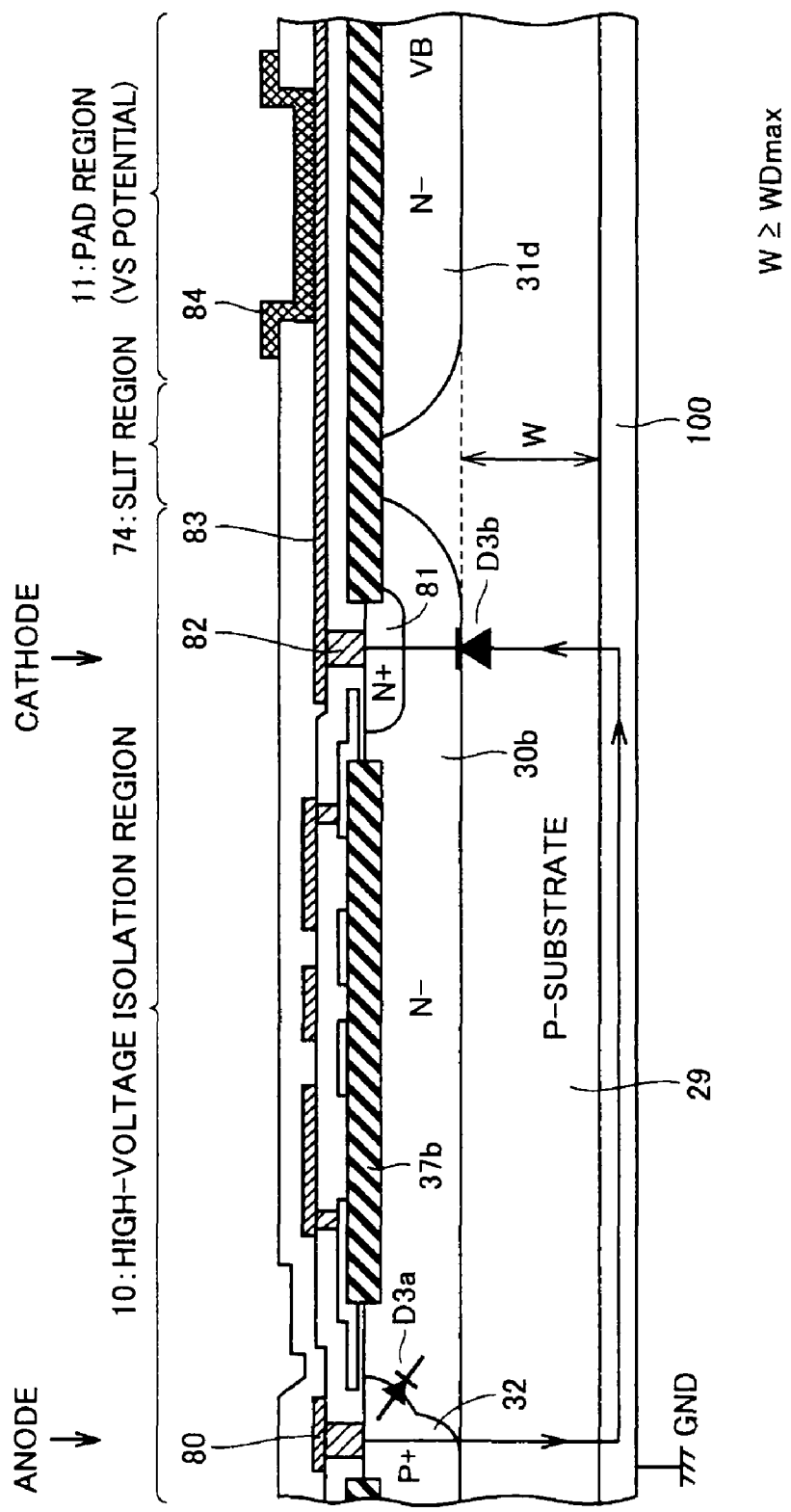
FIGS. 15 and 16 are schematic sectional views of a configuration of a high-voltage diode according to sixth and seventh embodiments, respectively, of the present invention.

FIG. 15 is a schematic sectional view of the high-voltage diode portion of a semiconductor device according to a sixth embodiment of the present invention. The sectional configuration of the high-voltage diode of FIG. 15 per se is identical to that of the high-voltage diode shown in FIG. 12. Corresponding elements have the same reference characters allotted, and detailed description thereof will not be repeated.

Referring to FIG. 15, common ground potential GND is supplied to anode electrode interconnection 80 via common ground terminal COM. Cathode electrode interconnection 82 is coupled to pad 11 where virtual ground potential VS is supplied via second electrode interconnection 83. In this case, pad 11 is formed at the region where the high-side logic circuit is provided in high potential island 9. Bootstrap power supply voltage VB is supplied to N type semiconductor layer 31d.

In a normal state, the PN junction between P type semiconductor substrate 29 and N type semiconductor layers 30b and 31d take a reverse-bias state. In this case, a depletion layer is formed at the PN junction. This depletion layer spreads extensively at the low impurity concentration region. The voltage across semiconductor layer 30b and P type semiconductor substrate 29 is VS-GND, whereas the voltage applied to the PN junction between semiconductor layer 31d and P type semiconductor substrate 29 is VB-GND. Virtual ground voltage VS attains a level lower than bootstrap power supply voltage VB (refer to FIG. 2). Therefore, the reverse bias voltage at the PN junction between N type semiconductor layer 31d and P type semiconductor substrate 29 is greater than the reverse bias voltage at the PN junction between N type semiconductor layer 30b and P type semiconductor substrate 29. In general, the relationship between the depletion layer width WD and voltage V applied to the PN junction is represented by the following equation:

$$WD = \sqrt{2 \cdot \in_s \cdot V/(q \cdot NA)} \quad (1)$$

where ∈s represents the dielectric constant of silicon forming the semiconductor substrate, q is the amount of elementary charge (the amount of charge per one electron), and NA is the impurity concentration of P type semiconductor substrate 29. Impurity concentration NA of P type semiconductor substrate 29 is sufficiently smaller than impurity concentration ND of N type semiconductor layer 31*d*.

P type semiconductor substrate 29 is the anode of high-voltage diode D3 (D3*a*, D3*b*). When current flows through back metal electrode 100, parasitic resistance occurs in the thickness direction of P type semiconductor substrate 29. This parasitic resistance should be made as small as possible. Therefore, the thickness of P type semiconductor substrate 29 must be minimized. However, a depletion layer spreads throughout P type semiconductor substrate 29. If back metal electrode 100 forms contact with the depletion layer, a high-amperage current will flow.

Therefore, the minimum film thickness of P type semiconductor substrate 29 is determined by the maximum value WDmax of depletion layer width WD. The film thickness of P type semiconductor substrate 29 is set substantially equal to maximum value WDmax of the depletion layer width so as to minimize the parasitic resistance component in the thickness direction. Accordingly, the parasitic resistance component of P type semiconductor substrate 29 can be set at the smallest value. The conducting capability is improved, allowing virtual ground potential VS of pad 11 to be clamped reliably even when negative surging occurs.

In FIG. 15, back metal electrode 100 is formed at the backside of semiconductor substrate 29. However, a similar effect can be achieved even in a configuration in which a lead frame (110) is further formed with respect to back metal electrode 100, as shown in FIG. 13.

Seventh Embodiment

Figure 16:
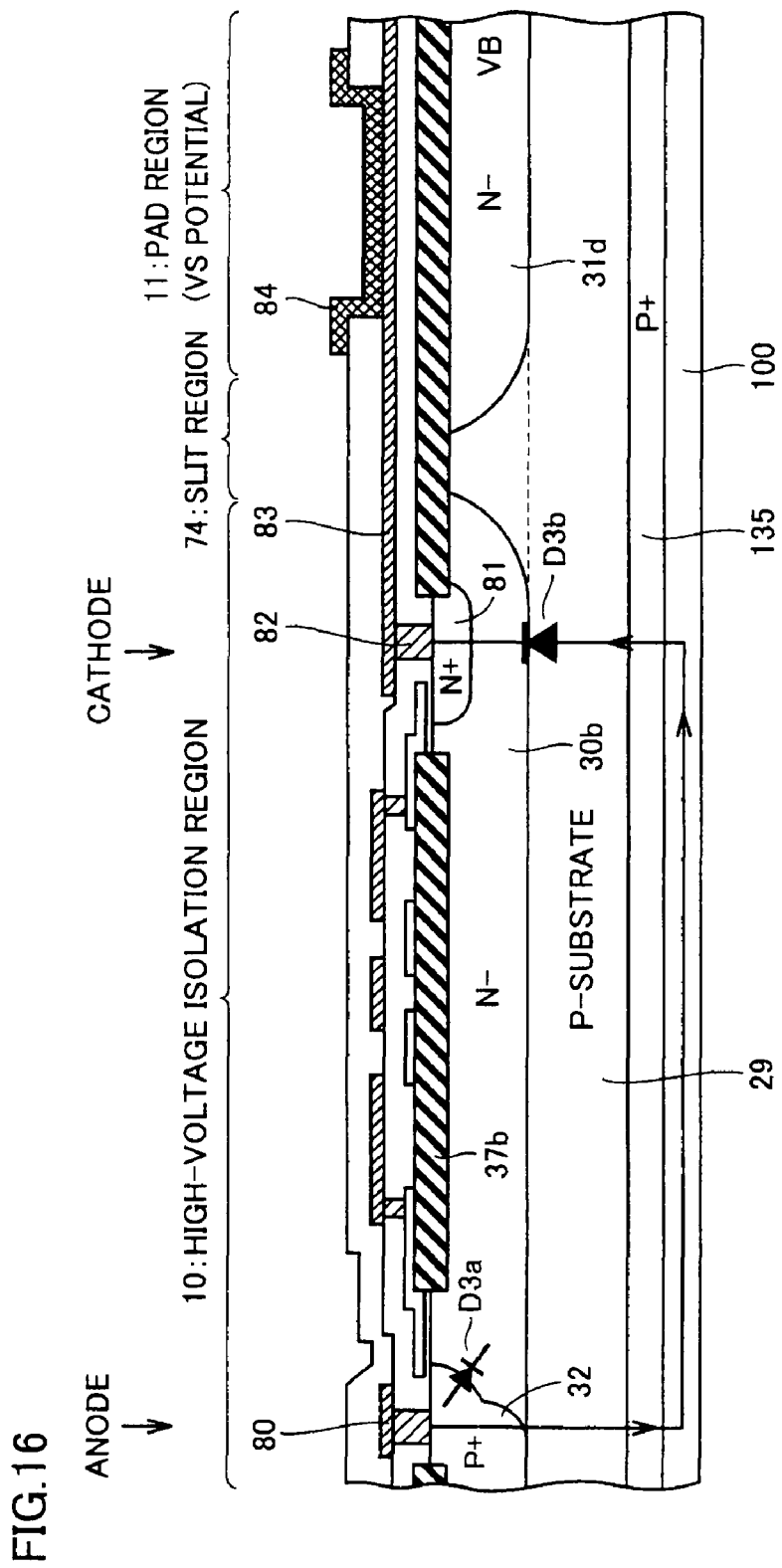

FIG. 16 is a schematic sectional view of a high-voltage diode of a semiconductor device according to a seventh embodiment of the present invention. The high-voltage diode of FIG. 16 differs in configuration from the high-voltage diode of FIG. 15 in that a P type semiconductor layer 135 of high concentration is provided between P type semiconductor substrate 29 and back metal electrode 100. The remaining configuration of the high-voltage diode of FIG. 16 is similar to that of the high-voltage diode of FIG. 15. Corresponding elements have the same reference characters allotted, and detailed description thereof will not be repeated.

Figure 17:
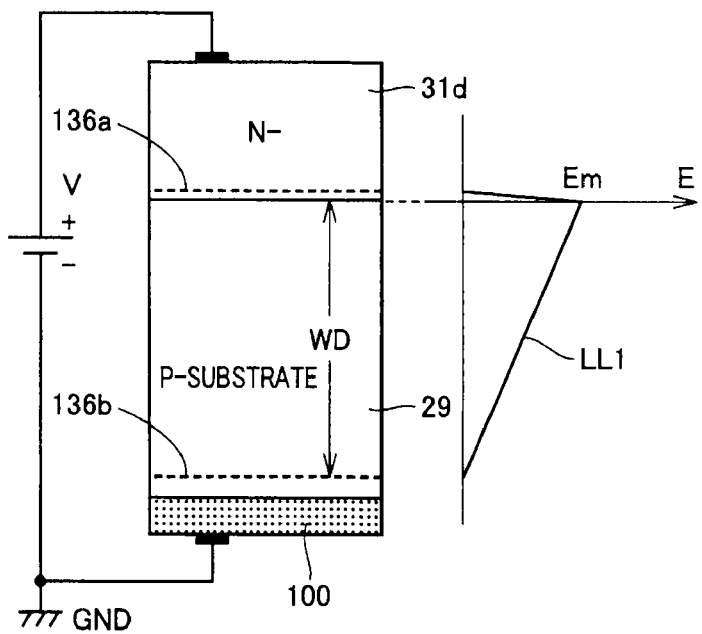
FIG. 17 represents the distribution of a depletion layer and an applied electric field when a P type semiconductor layer of high concentration is not provided.

FIG. 17 represents the spread of the depletion layer and field distribution thereof at P type semiconductor substrate 29 and N type semiconductor layer 31*d* in the case where P type semiconductor layer 135 of high concentration shown in FIG. 16 is not provided. Referring to FIG. 17, a positive electrode of power supply V is connected to N type semiconductor layer 31*d*, and a negative electrode of power supply V is connected to back metal electrode 100, supplying common ground voltage GND.

The impurity concentration of P type semiconductor substrate 29 is lower than the impurity concentration of N type semiconductor layer 31*d*, and a depletion layer spreads extensively at P type semiconductor substrate 29. At N type semiconductor layer 31*d*, the depletion layer spreads only slightly. Since there is no charge within depletion layer ends 136*a* and 136*b*, electric field E is applied evenly. At the PN junction portion, electric field E takes the maximum value Em. At the region of depletion layer width WD between depletion layer end 136*b* of P type semiconductor substrate 29 and the PN junction, electric field E decays linearly from maximum value Em to ground potential GND. Assuming that depletion layer end 136*a* is located substantially at the PN junction, ignoring the spread of the depletion layer at N type semiconductor layer 31*d*, the relationship among electric field E, depletion layer width WD, and applied voltage V is represented by the following equation.

$$V = Em \cdot WD/2 \qquad (2)$$

As represented by equation (2), the integrated value of electric field strength E in the depletion layer becomes applied voltage V, substantially equal to the triangular area enclosed by straight line LL1 of electric field strength E shown in FIG. 17.

Figure 18:
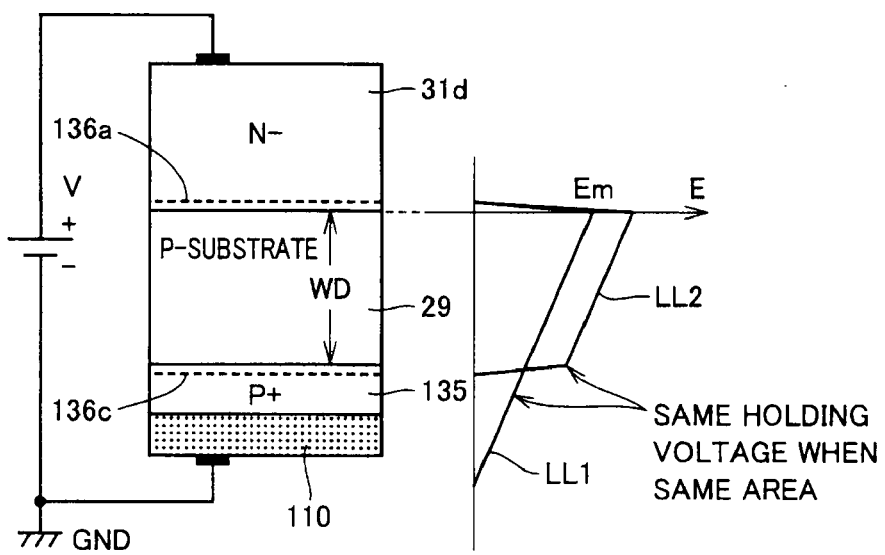
FIG. 18 represents the distribution of a depletion layer and an applied electric field at a high-voltage diode of FIG. 16.

FIG. 18 represents the depletion layer distribution and electric field strength distribution of the high-voltage diode according to the seventh embodiment of the present invention. As shown in FIG. 18, P type semiconductor layer 135 of high concentration is provided between P type semiconductor substrate 29 and back metal electrode 110. In the case of such a configuration, the depletion layer spread at P type semiconductor substrate 29 is abruptly eliminated at P type semiconductor layer 135 of high concentration. Therefore, width WD of the depletion layer at P type semiconductor substrate 29 and P type semiconductor layer 135 is determined by substantially the film thickness of P type semiconductor substrate 29.

When the area enclosed by electric field distribution straight line LL1 shown in FIG. 17, corresponding to the case where P type semiconductor layer 135 of high concentration is not provided, is equal to the area enclosed by broken line LL2 shown in FIG. 18, a voltage of a level identical to voltage V can be applied to the PN junction. In this case, the thickness of P type semiconductor substrate 29 required for holding a voltage of a level identical to that in the high-voltage diode of FIG. 17 can be reduced to approximately ½ that of the case where back high concentration P type semiconductor layer 135 is not provided. By setting the thickness of P type semiconductor substrate 29 approximately ½ times that of the structure shown in FIG. 17, the parasitic resistance component of P type semiconductor substrate 29 can be reduced. Accordingly, the conducting capability is improved. Virtual ground potential VS can be clamped at the level of a predetermined voltage speedily and reliably when VS undershooting occurs.

By setting the thickness of semiconductor substrate 29 in the range of at least ½ times and not more than ⅔ times the thickness of P type semiconductor substrate 29 of the high-voltage diode based on the structure of FIG. 17, the parasitic resistance component can be reduced while maintaining the required high-voltage characteristic.

The high-voltage diode of FIG. 16 may take a structure as shown in FIG. 13 in which a lead frame is electrically connected to back metal electrode 110.

Eighth Embodiment

Figure 19:
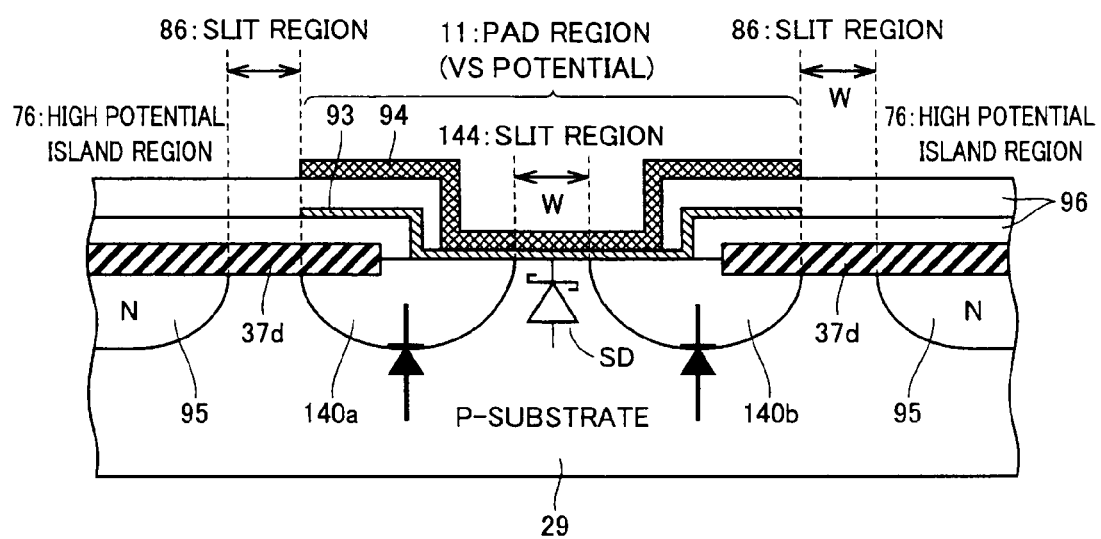
FIGS. 19 and 20 are schematic sectional views of the configuration of a high-voltage diode according to eighth and ninth embodiments, respectively, of the present invention.

FIG. 19 is a schematic sectional view of a configuration of a high-voltage diode of a semiconductor device according to an eighth embodiment of the present invention. The plan layout of the high-voltage diode of FIG. 19 is equal to the plan layout of the semiconductor device shown in FIG. 10.

The high-voltage diode of FIG. 19 differs in configuration from the high-voltage diode of FIG. 11, as set forth below. Specifically, N type semiconductor layers 140*a* and 140*b* are arranged spaced apart at the surface of semiconductor substrate 29 corresponding to the pad region where VS pad 11 is arranged. The surface of P type semiconductor substrate 29 is exposed at a slit region 144 located between N type semiconductor layers 140a and 140b. An electrode interconnection 93 is formed so as to contact N type semiconductor layers 140a and 140b and P type semiconductor substrate 29. An electrode interconnection 94 is formed on electrode interconnection 93. The terminated ends of electrode interconnections 93 and 94 extend as far as slit region 86 that isolates N type semiconductor layer 95 of high-voltage potential island region 9 from the pad region.

The remaining structure of the high-voltage diode of FIG. 19 is similar to that of the high-voltage diode of FIG. 11. Corresponding elements have the same reference characters allotted, and description thereof will not be repeated.

The width of slit region 86 is equal to the width of slit region 144, set at a width W.

According to the high-voltage diode of FIG. 19, electrode interconnection 93 is electrically in contact with P type semiconductor substrate 29, constituting a Schottky junction. At this region, a Schottky diode SD is formed. By setting the width of slit regions 86 and 144 equally to W, occurrence of electric field concentration at the boundary region between slit region 144 and N type semiconductor layers 140a and 140b can be prevented, maintaining the breakdown voltage characteristic.

In the region where a cathode electrode is formed, a plurality of slit regions 144 can be provided below the region of pad 11 shown in FIG. 10. The configuration thereof may be a rectangle or in stripes.

N type semiconductor layers 140a and 140b are always arranged at respective sides of the region (contact region) where electrode interconnections 93 and 94 form contact with the main surface of P type semiconductor substrate 29. By providing a PN junction at the end of slit region 144, degradation in breakdown voltage can be prevented. Further, a Schottky junction is introduced between electrode interconnection 93 and P type semiconductor substrate 29. The built-in potential of the Schottky diode can be set smaller than the PN junction diode. The forward dropping voltage VF varies exponentially according to the flowing current in the diode. If the forward dropping voltage VF by the built-in potential at the PN junction is relatively large at the region where the flowing current is low in such a case, the high-voltage diode (PN junction diode) does not conduct, disallowing a VS clamping operation at high speed. However, the built-in potential is low by the usage of Schottky diode SD, which allows the forward dropping voltage to be reduced. Therefore, virtual ground potential VS can be clamped speedily and reliably.

In the configuration shown in FIG. 19, an N type impurity region of high concentration may be provided at the surface of N type semiconductor layers 140a and 140b to prevent reduction in the resistance with respect to the electrode and contact with the depletion layer.

Ninth Embodiment

Figure 20:
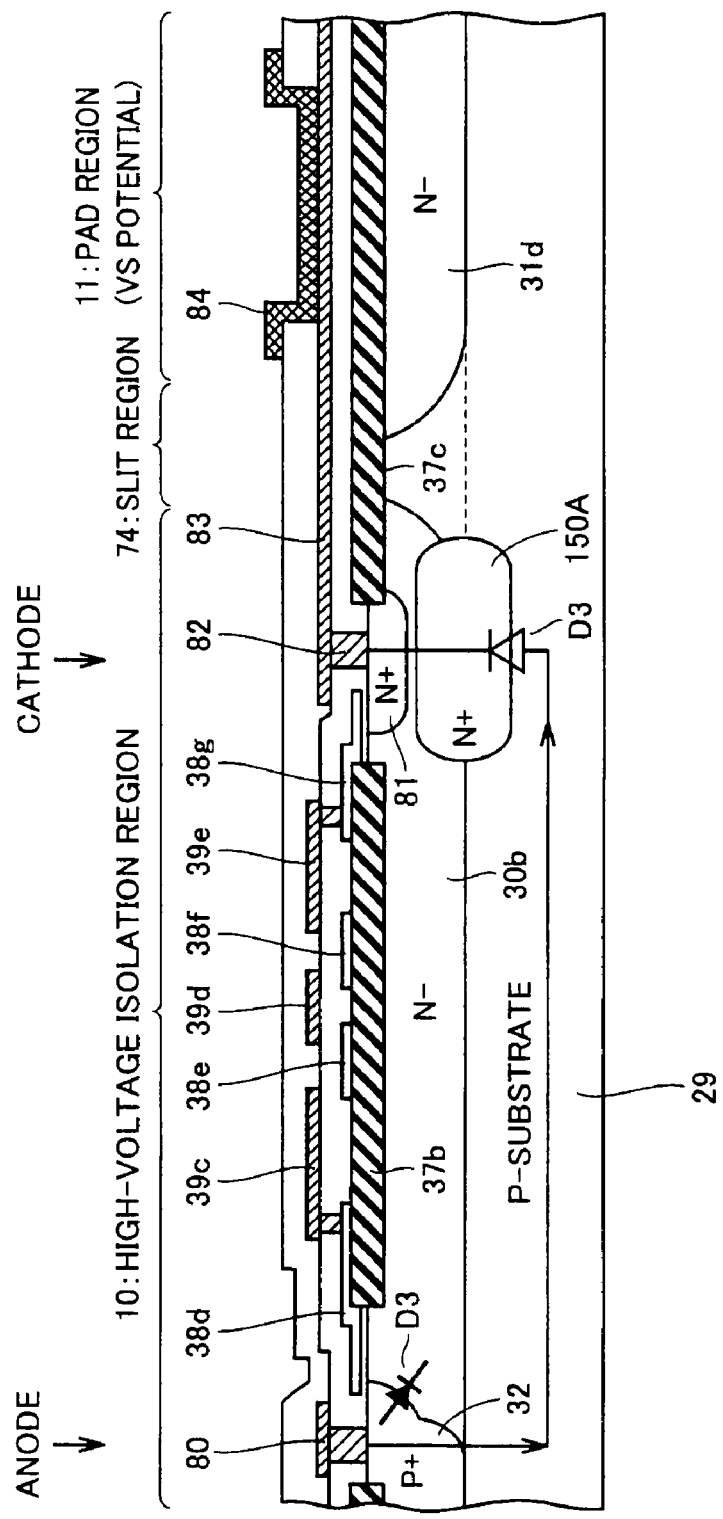

FIG. 20 is a schematic sectional view of a configuration of a high-voltage diode of a semiconductor device according to a ninth embodiment of the present invention. The high-voltage diode of FIG. 20 differs in configuration from the high-voltage diode of FIG. 9 in that an N type embedded impurity region 150A of high concentration is provided across N type semiconductor layer 30b and extending as far as to P type semiconductor substrate 29, below N type impurity region 81 of high concentration connected to cathode electrode interconnection 82. The remaining configuration of the high-voltage diode of FIG. 20 is similar to that of the high-voltage diode of FIG. 9. Corresponding elements have the same reference characters allotted, and detailed description thereof will not be repeated.

In the configuration of the high-voltage diode of FIG. 20, N type embedded impurity region 150A of high concentration is formed extending as far as to P type semiconductor substrate 29 from below N type impurity region 81. Therefore, the parasitic resistance at the path where current flows in the cathode electrode region can be further reduced. Thus, the conducting performance of the high-voltage diode for clamping is improved. Clamping can be carried out reliably, even if negative surge is applied to virtual ground potential VS of VS pad 11.

Modification of Ninth Embodiment

Figure 21:
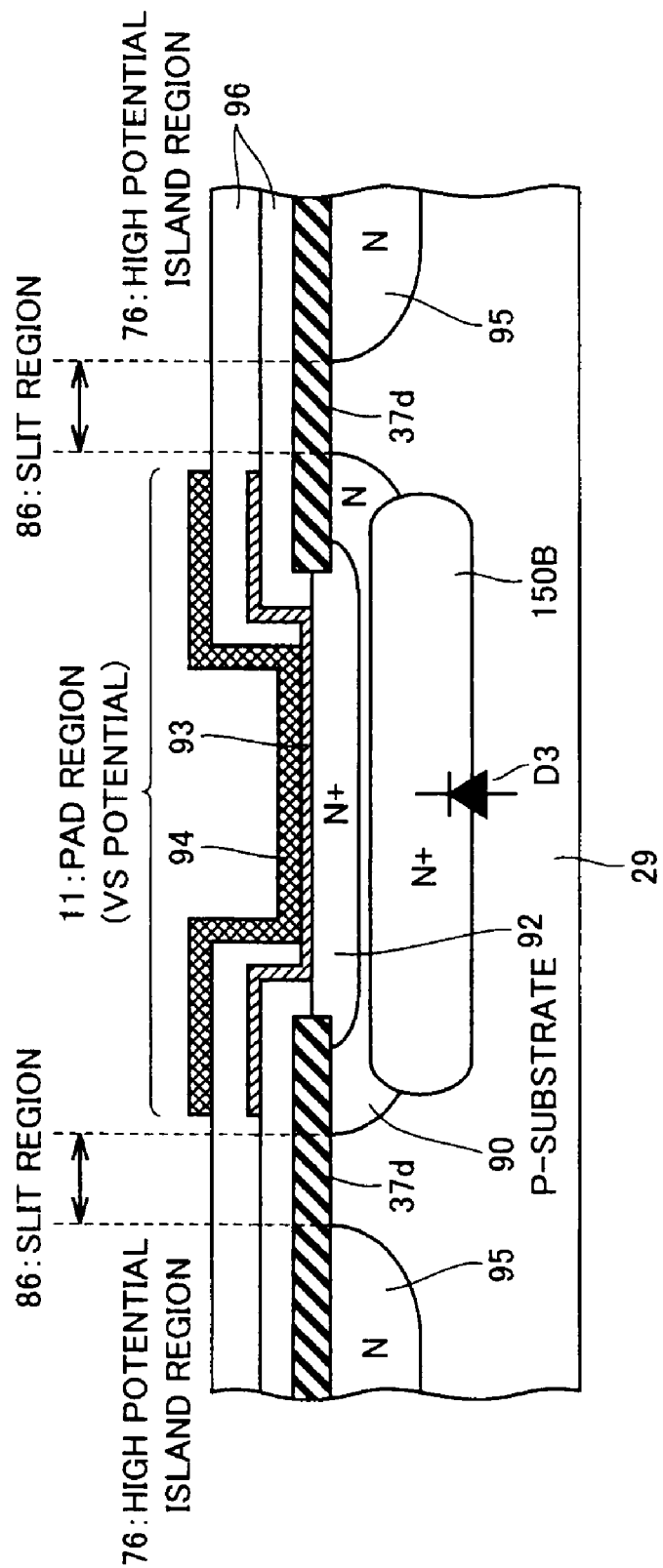
FIG. 21 is a schematic sectional view of a configuration of a modification of a high-voltage diode of the ninth embodiment.

FIG. 21 is a schematic sectional view of a high-voltage diode according to a modification of the ninth embodiment. The high-voltage diode of FIG. 21 differs in configuration from the high-voltage diode of FIG. 11 in that an N type embedded impurity region 150B of high concentration is provided below N type impurity region 92 of high concentration in the region of VS pad 11, extending beyond N type semiconductor layer 90 as far as into P type semiconductor substrate 29. The remaining configuration of the high-voltage diode of FIG. 21 is similar to that of the high-voltage diode of FIG. 11. Corresponding elements have the same reference characters allotted, and detailed description thereof will not be repeated.

According to the configuration of FIG. 21 in which N type embedded impurity region 150B of high concentration is provided, the parasitic resistance of the cathode region in the VS pad region of high-voltage diode D3 can be reduced (the parasitic resistance component of P type semiconductor substrate 29 and N type semiconductor layer 90 is reduced). Accordingly, the conducting performance is improved to ensure the clamping of virtual ground potential VS at the predetermined potential level.

FIGS. 20 and 21 show a configuration in which embedded impurity regions 150A and 150B are formed apart from N type impurity region 81 of high concentration located above. Alternatively, embedded impurity regions 150A and 150B may be formed in contact with N type impurity regions 81 and 92 of high concentration located above.

Tenth Embodiment

FIG. 22 is a schematic sectional view of a configuration of a high-voltage diode of a semiconductor device according to a tenth embodiment of the present invention. The high-voltage diode of FIG. 22 differs in configuration from the high-voltage diode of FIG. 11 in that an electrode interconnection 93A constituting the cathode electrode of high-voltage diode D3 is formed beyond slit region 86 as far as above external N type semiconductor layer 95. The remaining configuration of the high-voltage diode of FIG. 22 is similar to that of the high-voltage diode of FIG. 11. Corresponding elements have the same reference characters allotted, and detailed description thereof will not be repeated.

At slit region 86, the main surface of P type semiconductor substrate 29 is located between N type semiconductor layers 90 and 95. Consider the state where virtual ground potential VS supplied to VS (virtual ground potential) pad 11 is at the level of common ground potential GND. In this state, bootstrap power supply voltage VB is supplied at N type semiconductor layer 95. A depletion layer is generated at the region of the PN junction between P type semiconductor substrate 29 and N type semiconductor layer 95. Namely, a depletion layer end 136d is present at the bottom of N type semiconductor layer 95, whereas a depletion layer end 136e spreads along N type semiconductor layer 95 at the surface of P type semiconductor substrate 29.

The depletion layer extends from N type semiconductor layer 95 towards N type semiconductor layer 90 at the cathode region of high-voltage diode D3. In the case where depletion layer end 136e reaches N type semiconductor layer 90, N type semiconductor layer 95 is coupled with N type semiconductor layer 90 by a depletion layer, attaining a punch through state. In this case, leakage current may be generated between N type semiconductor layer 95 corresponding to the level of bootstrap power supply voltage VB and pad 11 corresponding to the level of common ground voltage GND. In order to prevent depletion layer end 136e from extending to N type semiconductor layer 90 from N type semiconductor layer 95 in such a state, first cathode electrode interconnection 93A is arranged so as to extend as far as above slit region 86. Thus, when first cathode electrode interconnection 93A is at the level of ground voltage GND, holes are drawn towards the surface of P type semiconductor substrate 29, suppressing the spread of depletion layer end 136e.

According to the tenth embodiment of the present invention, a cathode electrode interconnection is arranged extending as far as above the slit region isolating the N type semiconductor layer that becomes the substrate region for the high potential island region from the cathode electrode of the high-voltage diode. Accordingly, the depletion layer spreading between the N type semiconductor layer of the high-voltage diode and the semiconductor layer that is the substrate region of the high-voltage potential island region can prevent punchthrough. A high-voltage diode D3 operating stably can be implemented.

According to the tenth embodiment, a high-voltage diode structure for clamping according to the eighth embodiment constituting a Schottky diode may be employed as the high-voltage diode.

INDUSTRIAL FIELD OF APPLICATION

The semiconductor device of the present invention can be applied to a circuit driving a bridge-connected power transistor. A circuit that can drive a power transistor stably and reliably can be implemented.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device driving high potential side and low potential side power devices, said semiconductor device comprising:
   a low potential side circuit provided at a low potential region formed on a semiconductor substrate region for driving said low potential side power device,
   a high potential side circuit provided at a high potential region formed on said semiconductor substrate region, having a high voltage applied for driving said high potential side power device,
   a virtual ground potential pad arranged at said high potential region, coupled to a connection node of said high potential side and low potential side power devices for supplying a virtual ground potential to said high potential side circuit,
   a common ground potential pad supplying a common ground potential to said low potential side circuit and said high potential side circuit, and
   a high-voltage diode formed on said semiconductor substrate region, having a cathode electrically connected to said virtual ground potential pad, and an anode electrically connected to said common ground potential pad,
   wherein
   said semiconductor substrate region is of a first conductivity type,
   said high-voltage diode is arranged between said high potential region and said low potential region,
   said high-voltage diode includes
      a first semiconductor region of a second conductivity type, formed on said semiconductor substrate region, and constituting said cathode of said high-voltage diode, and
      a second semiconductor region of the first conductivity type formed to surround said first semiconductor region and to reach said semiconductor substrate region, constituting said anode of said high-voltage diode, said second semiconductor region electrically isolating said first semiconductor region from a semiconductor region of the second conductivity type formed on said semiconductor substrate region at said low potential region and said high potential region.

2. A semiconductor device driving high potential side and low potential side power devices, said semiconductor device comprising:
   a low potential side circuit provided at a low potential region formed on a semiconductor substrate region for driving said low potential side power device,
   a high potential side circuit provided at a high potential region formed on said semiconductor substrate region, having a high voltage applied for driving said high potential side power device,
   a virtual ground potential pad arranged at said high potential region, coupled to a connection node of said high potential side and low potential side power devices for supplying a virtual ground potential to said high potential side circuit,
   a common ground potential pad supplying a common ground potential to said low potential side circuit and said high potential side circuit, and
   a high-voltage diode formed on said semiconductor substrate region, having a cathode electrically connected to said virtual ground potential pad, and an anode electrically connected to said common ground potential pad,
   wherein
   said semiconductor substrate region is of a first conductivity type,
   said high-voltage diode includes
      a first semiconductor region of a second conductivity type, formed to surround said high potential region on said semiconductor substrate region, constituting said cathode of said high-voltage diode, and
      a second semiconductor region of the first conductivity type, formed to surround said first semiconductor region and to reach said semiconductor substrate region, constituting said anode of said high-voltage diode,
   said high potential region includes a third semiconductor region of the first conductivity type formed on said semiconductor substrate region, apart from said first semiconductor region, and having a high side power supply voltage of said high potential side circuit applied.

3. The semiconductor device according to claim 2, wherein said anode further includes a metal film formed at a backside of said semiconductor substrate region.

4. The semiconductor device according to claim 3, wherein said anode further includes a lead frame transmitting said common ground potential, electrically connected to said metal film, and on which said semiconductor device is mounted.

5. The semiconductor device according to claim 3, wherein said semiconductor substrate region has a film thickness substantially equal to a maximum value of a width of a depletion layer formed when a reverse bias voltage is applied to a PN junction with said first semiconductor region constituting said cathode.

6. The semiconductor device according to claim 3, wherein said high-voltage diode further includes a fourth semiconductor region of the first conductivity type, formed between said semiconductor substrate region and said metal film, and having a concentration higher than the concentration of said semiconductor substrate region.

7. The semiconductor device according to claim 6, wherein said semiconductor substrate region has a film thickness set to a range of ½ times to ⅔ times a maximum width of a depletion layer formed when a reverse bias voltage is applied to a PN junction with said first semiconductor region constituting said cathode of said high-voltage diode, when said fourth semiconductor region is not provided.

8. A semiconductor device driving high potential side and low potential side power devices, said semiconductor device comprising:
a low potential side circuit provided at a low potential region formed on a semiconductor substrate region for driving said low potential side power device,
a high potential side circuit provided at a high potential region formed on said semiconductor substrate region, having a high voltage applied for driving said high potential side power device,
a virtual ground potential pad arranged at said high potential region, coupled to a connection node of said high potential side and low potential side power devices for supplying a virtual ground potential to said high potential side circuit,
a common ground potential pad supplying a common ground potential to said low potential side circuit and said high potential side circuit, and
a high-voltage diode formed on said semiconductor substrate region, having a cathode electrically connected to said virtual ground potential pad, and an anode electrically connected to said common ground potential pad,
wherein
said high-voltage diode includes a first semiconductor region of a first conductivity type, constituting said cathode of said high-voltage diode, formed on said semiconductor substrate region, and electrically connected with said virtual ground potential pad, and
said semiconductor substrate region is of a second conductivity type, and constitutes said anode of said high-voltage diode.

9. The semiconductor device according to claim 8, wherein said cathode includes a conductor film, said conductor film including an electrode section formed in contact with a surface of said first semiconductor region below said virtual ground potential pad, and a plate section formed on said first semiconductor region with an insulation film thereunder.

10. A semiconductor device driving high potential side and low potential side power devices, said semiconductor device comprising:
a low potential side circuit provided at a low potential region formed on a semiconductor substrate region for driving said low potential side power device,
a high potential side circuit provided at a high potential region formed on said semiconductor substrate region, having a high voltage applied for driving said high potential side power device,
a virtual ground potential pad arranged at said high potential region, coupled to a connection node of said high potential side and low potential side power devices for supplying a virtual ground potential to said high potential side circuit,
a common ground potential pad supplying a common ground potential to said low potential side circuit and said high potential side circuit, and
a high-voltage diode formed on said semiconductor substrate region, having a cathode electrically connected to said virtual ground potential pad, and an anode electrically connected to said common ground potential pad,
wherein
said high-voltage diode includes first semiconductor regions of a first conductivity type constituting said cathode of said high-voltage diode, formed on said semiconductor substrate region, and electrically connected to said virtual ground potential pad, said first semiconductor regions being isolated from each other by a slit region below an electrode of said virtual ground potential pad,
said semiconductor substrate region is electrically connected to said virtual ground potential pad at said slit region, and
said semiconductor substrate region constitutes said anode of said high-voltage diode.

11. A semiconductor device driving high potential side and low potential side power devices, said semiconductor device comprising:
a low potential side circuit provided at a low potential region formed on a semiconductor substrate region for driving said low potential side power device,
a high potential side circuit provided at a high potential region formed on said semiconductor substrate region, having a high voltage applied for driving said high potential side power device,
a virtual ground potential pad arranged at said high potential region, coupled to a connection node of said high potential side and low potential side power devices for supplying a virtual ground potential to said high potential side circuit,
a common ground potential pad supplying a common ground potential to said low potential side circuit and said high potential side circuit, and
a high-voltage diode formed on said semiconductor substrate region, having a cathode electrically connected to said virtual ground potential pad, and an anode electrically connected to said common ground potential pad,
wherein
said semiconductor substrate region is of a first conductivity type,
said high-voltage diode includes
a first semiconductor region of a second conductivity type constituting said cathode of said high-voltage diode, formed on said semiconductor substrate region to surround said high potential region,
a metal film constituting a cathode electrode and formed on said first semiconductor region to surround said high potential region, electrically connected with said first semiconductor region, a second semiconductor region formed below said metal film so as to reach inside said semiconductor substrate region, having an impurity concentration higher than the impurity concentration of said first semiconductor region constituting said cathode, and a third semiconductor region of the first conductivity type formed to surround said first semiconductor region and to reach said semiconductor substrate region, constituting said anode of said high-voltage diode, and arranged apart from a region where said metal film is arranged, said first and second semiconductor regions are arranged apart from a semiconductor region of the second conductivity type to which a high side power supply voltage of said high potential side circuit is applied.

12. A semiconductor device driving high potential side and low potential side power devices, said semiconductor device comprising:

a low potential side circuit provided at a low potential region formed on a semiconductor substrate region for driving said low potential side power device, a high potential side circuit provided at a high potential region formed on said semiconductor substrate region, having a high voltage applied for driving said high potential side power device, a virtual ground potential pad arranged at said high potential region, coupled to a connection node of said high potential side and low potential side power devices for supplying a virtual ground potential to said high potential side circuit, a common ground potential pad supplying a common ground potential to said low potential side circuit and said high potential side circuit, and a high-voltage diode formed on said semiconductor substrate region, having a cathode electrically connected to said virtual ground potential pad, and an anode electrically connected to said common ground potential pad, wherein said high-voltage diode includes a first semiconductor region of a first conductivity type, constituting said cathode of said high-voltage diode, formed on said semiconductor substrate region, and electrically connected with said virtual ground potential pad, and a second semiconductor region formed below said first semiconductor region so as to reach inside said semiconductor substrate region, and having a concentration higher than the concentration of said first semiconductor region of the first conductivity type, said semiconductor substrate region is of a second conductivity type, and constitutes said anode of said high-voltage diode.

13. A semiconductor device driving high potential side and low potential side power devices, said semiconductor device comprising:

a low potential side circuit provided at a low potential region formed on a semiconductor substrate region for driving said low potential side power device, a high potential side circuit provided at a high potential region formed on said semiconductor substrate region, having a high voltage applied for driving said high potential side power device, a virtual ground potential pad arranged at said high potential region, coupled to a connection node of said high potential side and low potential side power devices for supplying a virtual ground potential to said high potential side circuit, a common ground potential pad supplying a common ground potential to said low potential side circuit and said high potential side circuit, and a high-voltage diode formed on said semiconductor substrate region, having a cathode electrically connected to said virtual ground potential pad, and an anode electrically connected to said common ground potential pad, wherein said high-voltage diode includes a first semiconductor region of a first conductivity type, constituting said cathode of said high-voltage diode, formed on said semiconductor substrate region, and a metal film formed to be electrically connected with said first semiconductor region, and functioning as a cathode electrode and said virtual ground potential pad, said semiconductor substrate region is of a second conductivity type, and constitutes said anode of said high-voltage diode, said first semiconductor region is arranged apart from a high potential semiconductor region of the first conductivity type to which a high side power supply voltage of said high potential side circuit is applied, and said metal film includes a portion arranged as far as above said high potential semiconductor region with an insulation film therebetween.

* * * * *